US009596073B1

(12) United States Patent
Reyes et al.

(10) Patent No.: US 9,596,073 B1
(45) Date of Patent: Mar. 14, 2017

(54) PICOSECOND CLOCK SYNCHRONIZATION TECHNIQUE FOR COMMUNICATION AND NAVIGATION PLATFORM EQUIPMENT

(71) Applicant: Rockwell Collins, Inc., Cedar Rapids, IA (US)

(72) Inventors: Gina M. Reyes, Iowa City, IA (US); Jason H. Timmerman, Tiffin, IA (US); James H. Doty, Cedar Rapids, IA (US); Patrick Y. Hwang, Cedar Rapids, IA (US); Guolin Peng, Marion, IA (US); Gary A. McGraw, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 14/993,973

(22) Filed: Jan. 12, 2016

(51) Int. Cl.
*H04L 7/04* (2006.01)
*H04L 7/00* (2006.01)

(52) U.S. Cl.
CPC .......... *H04L 7/0037* (2013.01); *H04L 7/0045* (2013.01)

(58) Field of Classification Search
None
See application file for complete search history.

(56) References Cited

U.S. PATENT DOCUMENTS

2014/0311253 A1* 10/2014 Iwasa ................ G01F 1/662
    73/861.21
2015/0185179 A1*  7/2015 Bohets ............... G01N 27/3335
    204/405

OTHER PUBLICATIONS

Silicon Labs, SyncE and IEEE 1588: Sync Distribution for a Unified Network, Jul. 2014, Silicon Laboratories, 16 pages.
Pedro Moreira et al., Digital Dual Mixer Time Difference for Sub-Nanosecond Time Synchronization in Ethernet, Jun. 2010, Frequency Control Symposium (FCS), 2010 IEEE International, pp. 449-453.
Opher Ronen et al., Enhanced Synchronization Accuracy in IEEE1588, Precision Clock Synchronization for Measurement, Control, and Communication (ISPCS), 2015 IEEE International Symposium, Oct. 11-16, 2015, pp. 76-81.

(Continued)

*Primary Examiner* — Shuwang Liu
*Assistant Examiner* — Gina McKie
(74) *Attorney, Agent, or Firm* — Angel N. Gerdzhikov; Donna P. Suchy; Daniel M. Barbieri

(57) ABSTRACT

Systems and related methods for simultaneous high precision synchronization and syntonization of multiple sensors or clocks utilize a precision estimator that receives clock signals and time mark signals from both sensors (a reference sensor and a clock to be measured against the reference sensor). A precision time and frequency estimator determines a time offset, frequency offset, and phase offset of the measured sensor relative to the reference sensor. Associated systems can additionally determine the propagation delay between two remote subsystems connected by a communications channel. The communications channel may be a bidirectional duplexed or multiplexed channel allowing for mutual exchange of timing information along a single non-dedicated cable between sensors. Sensors may be synchronized to within 10 ps of each other without the need for THz clocks or fiber-optic cabling.

20 Claims, 19 Drawing Sheets

(56) References Cited

OTHER PUBLICATIONS

J. Serrano, et al., The White Rabbit Project, 2013, Found online at <http://www.whiterabbitsolution.com/files/wr_ibic_2013.pdf>, 7 pages.

Gina Reyes et al., Picosecond-level Timing and Frequency Coordination Between Dissimilar Clocks, The Institute of Navigation, Jan. 27, 2016, 7 pages.

J. Serrano et al., The White Rabbit Project, Proceedings of ICALEPCS2009, Kobe, Japan, Oct. 12-16, 2009, 3 pages.

David W. Allan et al., Picosecond Time Difference Measurement System, 29th Annual Symposium on Frequency Control, 1975, IEEE, pp. 404-411.

Tomasz Wlostowski, Precise time and frequency transfer in a White Rabbit network, Master's thesis, Warsaw University of Technology, May 2011, 98 pages.

Maciej Lipinski, White Rabbit Ethernet-based solution for sub-ns synchronization and deterministic, reliable data delivery, Jul. 15, 2013, IEEE Plenary Meeting Geneve, 70 pages.

\* cited by examiner

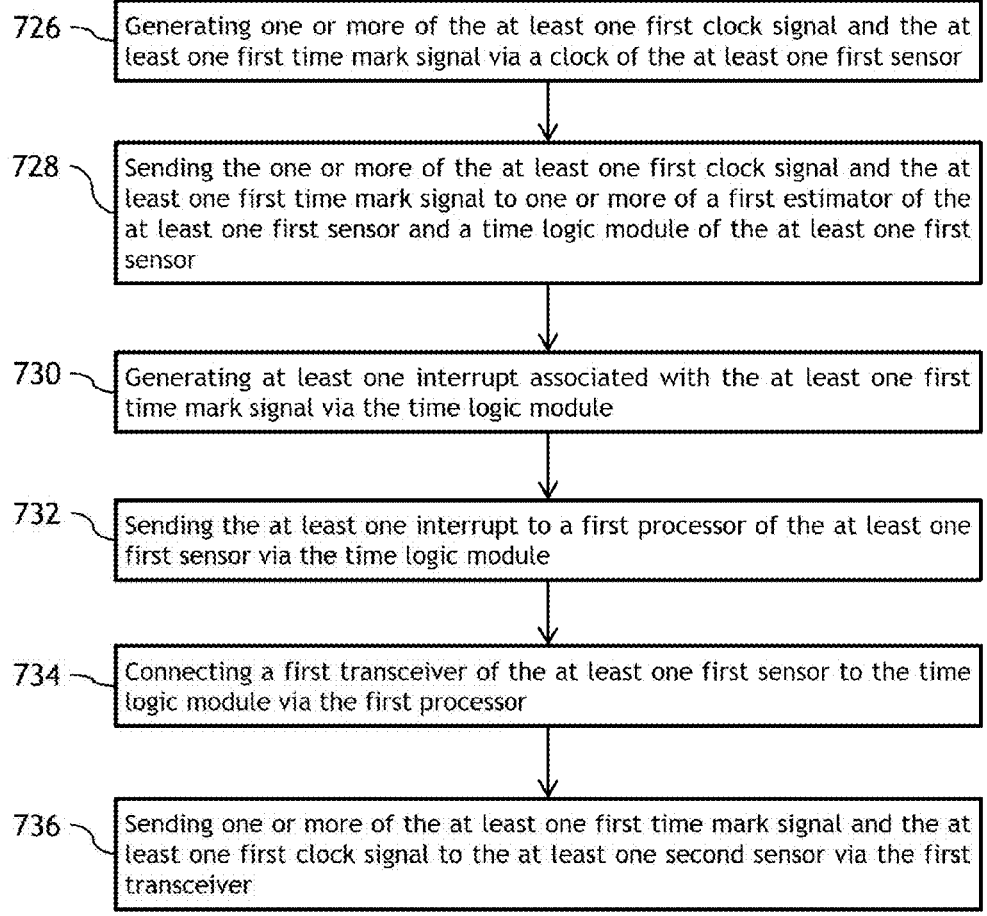

700

```
        ┌─────────┐
        │ FIG. 8A │
        └────┬────┘
             ▼
738 ─┌──────────────────────────────────────────────────────────┐
     │ Receiving the at least one first time mark signal via a  │
     │ second transceiver of the at least one second sensor     │
     └──────────────────────────────────────────────────────────┘
             │
             ▼
740 ─┌──────────────────────────────────────────────────────────┐
     │ Connecting a second estimator of the at least one second │
     │ sensor to the second transceiver via a second processor  │
     │ of the at least one second sensor                        │
     └──────────────────────────────────────────────────────────┘
             │
             ▼
742 ─┌──────────────────────────────────────────────────────────┐
     │ Receiving, via the second estimator, the at least one    │
     │ first clock signal from the at least one first sensor    │
     └──────────────────────────────────────────────────────────┘
```

FIG. 8D

PICOSECOND CLOCK SYNCHRONIZATION TECHNIQUE FOR COMMUNICATION AND NAVIGATION PLATFORM EQUIPMENT

BACKGROUND

In federated architectures, individual sensors, components, and devices may be clocked independently because their designs are optimized, or their development matured, separately from each other. As modern advanced distributed systems become more highly integrated, the need increases for information fusion of data originating with these federated sensors that requires both tight timing synchronization and frequency syntonization. For example, sensors in RF ranging/timing systems may require navigation-level timing synchronization at a precision level of 1 ns or less. Similarly, signal intelligence (SIGINT) applications may require the coordination of frequency syntonization to a precision level on the order of 0.1 ppb or less.

Conventional approaches to this problem include, for example, the use of Time Interval Counters (TIC) to measure the time difference between two events as defined by pulses originating from two independent sources. These pulses may be derived from a clock pulse but must be shaped with very sharp edges, and transported via broadband cabling, to preserve the high frequencies associated with such sharp edges. The high frequency content necessary to maintain such sharp pulse edges may extend considerably higher than the clock's own intrinsic frequency. In addition, to prevent ambiguity in the identification of a pulse, the pulses may be transmitted at a relatively low rate (e.g., once per second). However, the need to limit the pulse transmission rate may require excessive time to average out sampling errors. For systems requiring quick synchronization or that use more cost-effective and less stable clocks, such long averaging times may result in reduced relative timing accuracy. Furthermore, to achieve the desired performance (e.g., synchronization to within 10 ps) via TIC or other absolute timing based approached would require terahertz (THz, $10^{12}$ Hz) level clock signals. Terahertz signals are not supported by the traditional copper cabling installed aboard aircraft or other platforms, and would require a costly upgrade to fiber optic cabling.

In addition, the limit of the integer resolution of the local oscillator clock used to time the interval between two pulses generally requires a high sampling frequency for precise relative timing. To mitigate this need for high frequency references (e.g., 50 GHz for 20 ps), interpolation techniques may be employed. Interpolation may allow fractional clock cycle counting which increases resolution beyond that of the local clock. Time to Digital Converter (TDC) techniques can be implemented on a low-cost field programmable gate array (FPGA); the Vernier method may achieve uncertainly of <100 ps, and fully digital systems typically achieve 50-500 ps. However, the use of TDC techniques increases implementation complexity; furthermore, TDC techniques are limited to providing time difference information between input clocks and cannot provide frequency difference information.

Another approach, a Dual Mixer Time Difference (DMTD) system (including digital DMTD (DDMTD) implementations), may determine the phase difference of two clock signals of the same nominal frequency by mixing the two signals with an internal clock signal of slightly different frequency to generate a low-frequency output (relative to the clock signals) for analysis by a TIC. With respect to DMTD/DDMTD-type systems, traditional methods of disseminating time or frequency information (e.g., Network Time Protocol (NTP), Precision Time Protocol (PTP), Inter-Range Instrumentation Group (IRIG)) cannot provide the required precision and distribution for equipment incorporating a significant cable delay (e.g., 2 km). For example, DMTD/DDMTD systems may calculate cable delay from coarse offsets using time-tagged two-way messaging, and calculate fine phase offsets via DDMTD to syntonize system clocks to a master clock. While DMTD and DDMTD implementations may work well in controlled environments incorporating highly stable clocks of common frequency, many real-world airborne, vehicle-based, remote, or ground-station applications may not include sensors of similar frequency or consistent phase (due, e.g., to their cost). Similarly, such applications may not tolerate syntonization of their sensors (due, e.g., to the need to maintain fault independence).

SUMMARY

In one aspect, embodiments of the inventive concepts disclosed herein are directed to a system for synchronizing a reference sensor (e.g., a reference clock) and a measured sensor which may be compared to the reference sensor. The reference sensor and the measured sensor may generate a clock signal having a particular frequency and a time mark signal (e.g., event signal, disambiguation signal). The system may include a precision time/frequency estimator (PTFE) coupled to the sensors and configured to determine an output. The PTFE output may include a difference in time (e.g., a number of cycles of a clock signal between time mark signals) between the reference and measured sensors, a difference of the frequencies of the respective clock signals generated by the reference and measured sensors, and a difference in phase between the respective clock signals. The PTFE may include a sampler for determining a state of the measured clock signal based on a phase of the reference clock signal. The PTFE may include an oscillator for predicting a state of the measured clock signal based on the reference clock signal, the determined frequency difference, and the determined phase difference. The PTFE may include a state compare module for determining errors by comparing the determined state of the measured clock signal to its predicted state. The PTFE may include a control filter for generating corrected frequency and phase differences based on accumulated errors, and sending the corrected frequency and phase differences to the oscillator.

In a further aspect, embodiments of the inventive concepts disclosed herein are directed to a method for synchronizing a reference sensor and a measured sensor. The method may include determining a time offset associated with the reference sensor and the measured sensor (e.g., an offset of the measured sensor relative to the reference sensor) by determining a number of cycles of a reference clock signal generated by the reference sensor between a reference time mark signal generated by the reference sensor and a measured time mark signal generated by the measured sensor. The method may include determining a state of a measured clock signal generated by the measured sensor based on a phase of the reference clock signal. The method may include predicting a state of the measured clock signal based on the reference clock signal; a frequency offset associated with the reference clock signal and the measured clock signal; and a phase offset associated with the reference clock signal and the measured clock signal. The method may include determining errors by comparing the determined state of the measured clock signal to the predicted state of the measured clock signal. The method may include correcting the frequency offset and the phase offset based on accumulated determined errors.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIGS. 8A, 8B, 8C, and 8D are process flow diagrams illustrating a method according to embodiments of the inventive concepts disclosed herein.

DETAILED DESCRIPTION OF EXEMPLARY EMBODIMENTS

Figure 1:
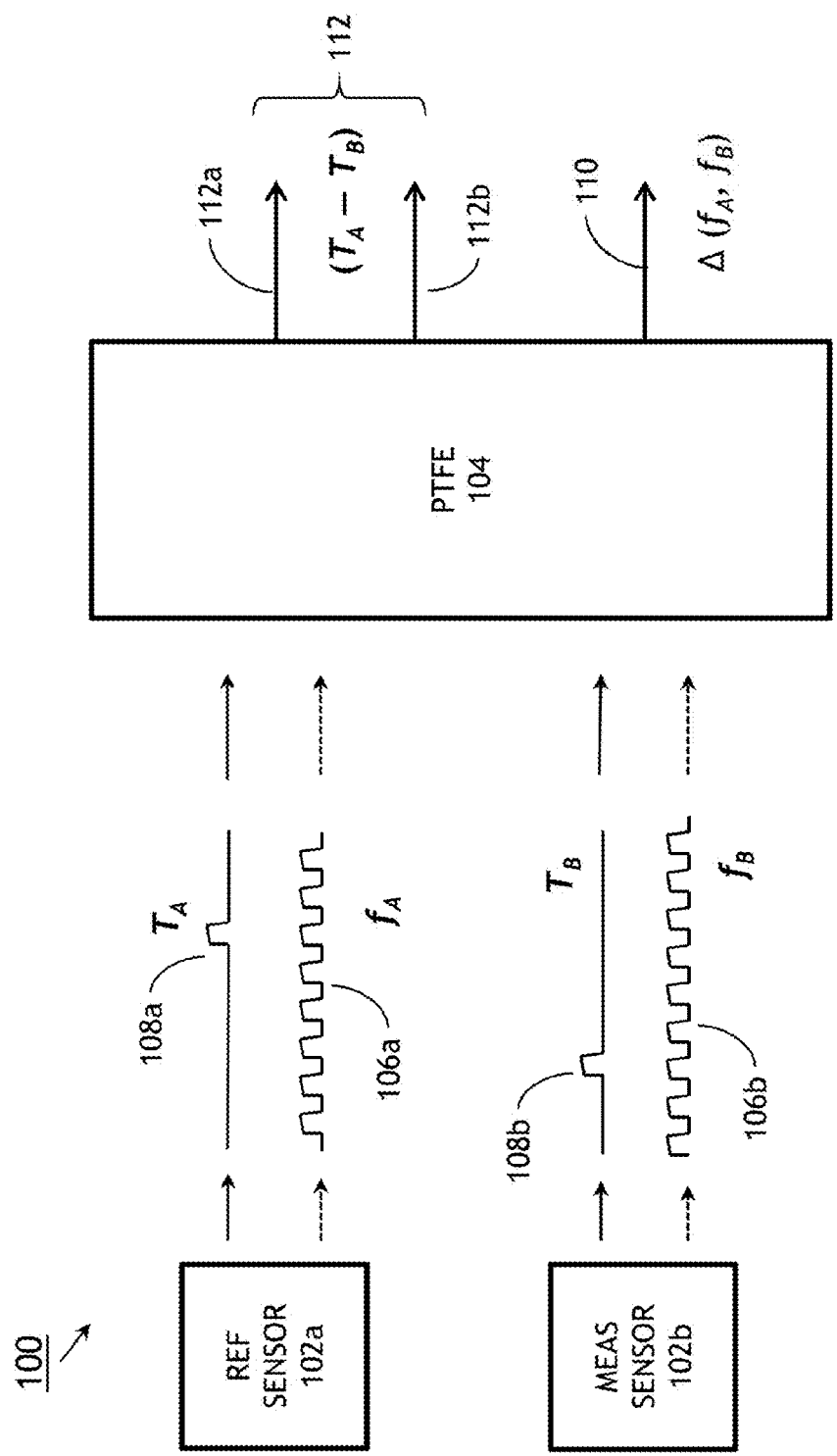
FIG. 1 illustrates an exemplary embodiment of a system according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a' and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system for simultaneous synchronization and syntonization of multiple sensors or clocks, thus allowing devices connected by an aerial or terrestrial network to be synchronized to within 10 ps of each other without the need for THz clocks or fiber-optic cabling. The relative frequency and phase between two clock signals (e.g., of a measured clock signal relative to a reference clock signal) may be determined. The time mark signals generated by each sensor used to resolve integer ambiguity as to which cycle of each clock signal is associated with a particular absolute time or time mark signal, dispensing with the need to maintain a sharp low noise and jitter edge of a pulse event.

A precision time/frequency estimator (PTFE) according to embodiments of the inventive concepts disclosed herein, or a precision time/frequency interface (PTFI) incorporating more than one PTFE, may use a clock signal that provides many more edges or phase transitions per unit of time, thereby reducing the time required to average out any noise or jitter in the clock lines and eliminating the need for sharp low-noise timing pulses between systems. One benefit of this approach is that bandwidth demands for generating and transporting the required time mark signals and clock signals are much lower than in conventional approaches (e.g., 10 MHz RF frequencies as opposed to ultra-fast optical pulses). In addition, timing synchronization and frequency syntonization may be simultaneously tracked in real time with high precision, creating a virtual clock at each sensor for tracking the difference with other such sensor clocks within the system. Such real-time tracking of relative time, phase, and frequency offsets allows the use of lower-stability, low-cost quartz clocks in systems that do not otherwise need a precision clock. Furthermore, real-time tracking allows such lower-stability clocks to be continually calibrated with respect to a high-stability clock, providing the benefit of the high-stability clock throughout system timing. PTFE functionality may be efficiently implemented digitally and hosted on compact devices, or hosted on existing processors shared with other functions; the PTFE is replicable and configurable for multiple uses within a federated architecture or distributed system.

Referring now to FIG. 1, an exemplary embodiment of a system 100 according to the inventive concepts disclosed herein includes one or more sensors 102a-b and a precision time-frequency estimator (PTFE) 104. For example, a sensor (e.g., clock) 102a may be a reference sensor (e.g., a sensor 102a against which another sensor 102b is measured) that generates a reference clock signal 106a at a frequency $f_A$ and a reference time mark signal (e.g., disambiguation pulse, event pulse) 108a at periodic times $T_A$. A sensor 102b may be a measured sensor that generates a clock signal 106b at a frequency $f_B$ and a time mark signal 108b at periodic times $T_B$. The PTFE 104 may incorporate either or both of the sensors 102a-b, or the PTFE 104 may be remotely situated from both sensors 102a-b. The PTFE 104 may receive the reference clock signal 106a and reference time mark signal 108b generated by the reference sensor 102a and the clock signal 106b and time mark signal 108b generated by the measured sensor 102b, generating a precise frequency difference 110 of the sensors 102a-b. For example, the PTFE 104 may determine the frequency difference 110 as $\Delta(f_A, f_B)$, or the frequency of the clock signal 106b relative to the frequency of the reference clock signal 106a. Similarly, the PTFE may determine a time difference 112 between the sensors 102a-b. The determined time difference 112 may include an integer time difference 112a equivalent to a number of integer clock cycles of the frequency $f_A$ of the reference clock signal 106a between an occurrence of the reference time mark signal 108a at time $T_A$ and an occurrence of the time mark signal 108b at time $T_B$. The determined time difference may include a phase difference 112b (e.g., relative phase) between the two sensors 102a-b. For example, the PTFE 104 may determine a phase or portion of a cycle of the frequency $f_A$ that the frequency $f_B$ of the clock signal 106b is ahead of, or behind, the frequency $f_A$ at the current cycle (clock edge) of the frequency $f_A$. In embodiments of the system 100, the sensor 102b may be a reference sensor against which the sensor 102a is measured.

Figure 2A:
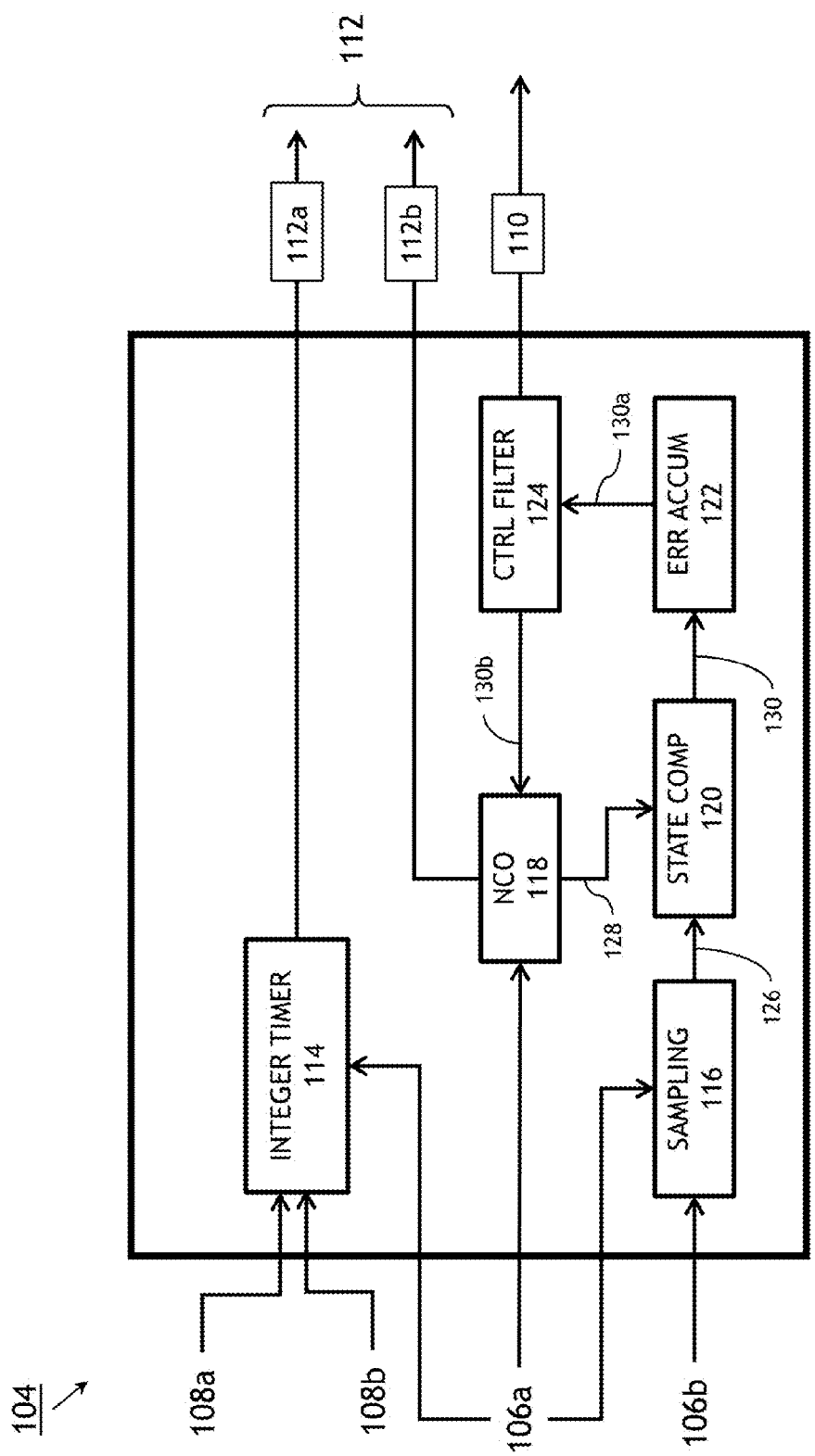
FIG. 2A illustrates an exemplary embodiment of a precision time/frequency estimator according to the inventive concepts disclosed herein.

Referring now to FIG. 2A, an exemplary embodiment of a PTFE 104 according to the inventive concepts disclosed herein includes an integer timer 114, a sampling subsystem 116, a numerically controlled oscillator (NCO) 118, a state compare module 120, an error accumulator 122, and a control filter 124. The integer timer 114 may generate the integer time difference 112a by determining the number of integer clock cycles of the frequency $f_A$ of the reference clock signal 106a between the reference time mark signal 108a (at time $T_A$) and an occurrence of the time mark signal 108b (at time $T_B$). The sampling subsystem 116 may determine a state (126) of the sampled clock signal 108b (operating at frequency $f_B$) at a particular phase of the reference clock signal 108a (operating at frequency $f_A$). The NCO 118 may predict (128) a state of the clock signal 108b based on estimates of the frequency difference 110 between the two sensors 102a-b and the phase difference 112b between the two sensors 102a-b. At each cycle of the reference clock signal 106a, the NCO 118 may estimate the phase difference 112b of the reference clock signal 106a and the clock signal 106b, sending the estimate (128) to the state compare module 120 and as an output (112b) of the PTFE 104. The phase difference 112b, along with the integer time difference 112a determined by the integer timer 114, may be used to determine an unambiguous and precise relative time between the measured sensor 102b and the reference sensor 102a (FIG. 1).

The state compare module 120 may compare the predicted state 128 of the clock signal 106b with the determined state 126 of the clock signal 106b (as determined by the sampling subsystem 116); any errors (130) in the prediction by the NCO 118 of the predicted state 128 of the clock signal 108b may be accumulated by the error accumulator 122 and periodically sent (130a) to the control filter 124. The control filter 124 may determine, based on the received accumulated errors 130a, corrections to the estimates of the frequency difference 110 and phase difference 112b used by the NCO 118 to predict the state 128 of the clock signal 108b. The corrected estimates (130b) of the frequency difference 110 and phase difference 112b may be sent to the NCO 118 by the control filter 124, and the frequency difference 110 output by the PTFE 104.

Figure 2B:
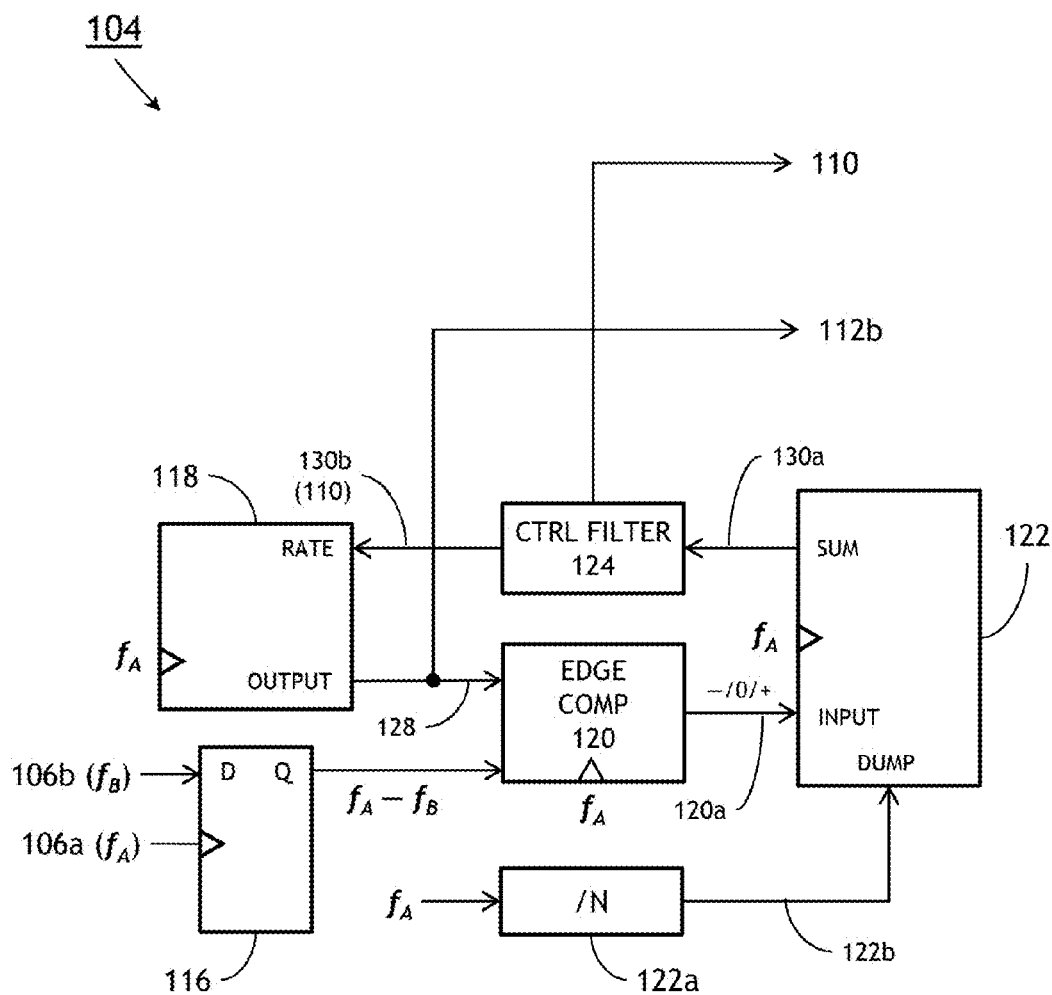
FIG. 2B illustrates an exemplary digital embodiment of the system of FIG. 2A according to the inventive concepts disclosed herein.

Referring to FIG. 2B, an exemplary digital embodiment of the PTFE 104 (FIG. 2A) includes a sampling subsystem 116 wherein a D (data) flip-flop may measure the signal level of the measured clock signal 106b (high or low state) at the edges of the reference clock signal 106a. If the clocks are relatively close in frequency, the sampled signal may have a nominal frequency of $f_A-f_B$ (with high frequency jitter caused by quantization and noise and jitter on the clock signals 106a-b). If the difference between $f_A$ and $f_B$ is greater than nominal, the frequency of the sampled signal may be offset and the sign reversed due to aliasing. The state compare (edge compare) function 120 may output a positive, zero, or negative value (120a) based on whether the sampled signal or the predicted state 128 predicted by the NCO 118 transitions first. For example, if the NCO 118 predicts a high-low transition, two samples of the reference clock signal 106a (e.g., two cycles of $f_A$) before the sampled measured clock signal 106b ($f_A-f_B$), the state compare module 120 may output an error signal of 2 (+1/+1). If the NCO 118 predicts a high-low transition, three samples of the reference clock signal 106a (e.g., two cycles of $f_A$) after the sampled measured clock signal 106b ($f_A-f_B$), the state compare module 120 may output an error signal of −3 (−1/−1/−1). If the NCO 118 predicts a high-low transition concurrent with the sampled measured clock signal 106b ($f_A-f_B$), the output of the state compare module 120 may not output any error signals (output zero). The error accumulator 122 may add up any error signals received from the state compare module 120 and dump the total (130a) to the control filter 124 by sending the data and resetting to zero. The PTFE 104 may use a divider 122a to generate an accumulator dump pulse (122b) every N cycles of $f_A$ (the selection of N based on the desired frequency of data generation). The control filter 124 may use accumulated errors 130a to adjust the frequency and phase of the NCO 118 by sending frequency and phase corrections (130b); the frequency corrections may be output by the PTFE 104 as the frequency difference 110, while the running output of the NCO 118 may be output by the PTFE 104 as the phase difference 112b (e.g., the relative phase offset between the reference and measured clock signals 106a-b).

Figure 2C:
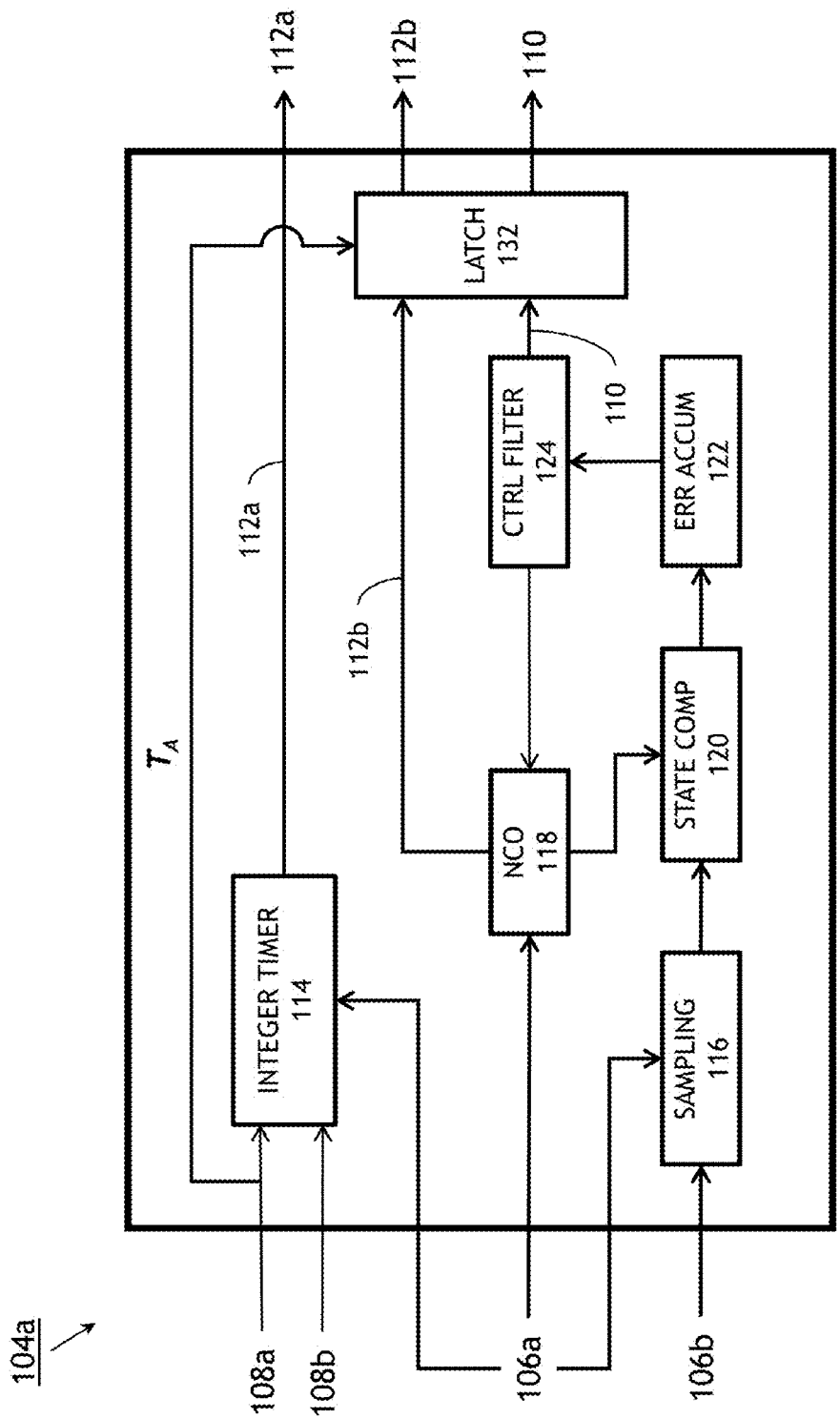
FIG. 2C illustrates an exemplary embodiment of a precision time/frequency estimator according to the inventive concepts disclosed herein.

Referring now to FIG. 2C, an exemplary embodiment of a PTFE 104a according to the inventive concepts disclosed herein is implemented similarly to the PTFE 104 (FIG. 2A), except that one or more latches 132 are incorporated by the PTFE 104a. For example, the PTFE 104 as shown by FIG. 2A may output the frequency difference 110 at the update rate of the control filter 124 and the time offsets (the integer time difference 112a and phase difference 112b) at every cycle of the reference clock signal 106a (at frequency $f_A$), which may be a faster data rate than some applications can handle. At every last cycle (frequency $f_A$) of the reference clock signal 106a before the reference time mark signal 108a, the latches 132 may capture an instantaneous estimate of the integer time difference 112a, the phase difference 112b, and the frequency difference 110. The frequency of the reference time mark signal 108a (e.g., the frequency between $T_A$ events) may be optimized for overall system digital communications rates and to ensure an unambiguous time of the reference sensor 102a at each $T_A$ event of the reference time mark signal 108a. However, the trigger for the latches 132 is not restricted to $T_A$ events and may be selected based on any desired combination of factors, including the stability of any clocks or sensors 102a-b of the system 100 or accuracy requirements for measurement of time and frequency.

Figure 2D:
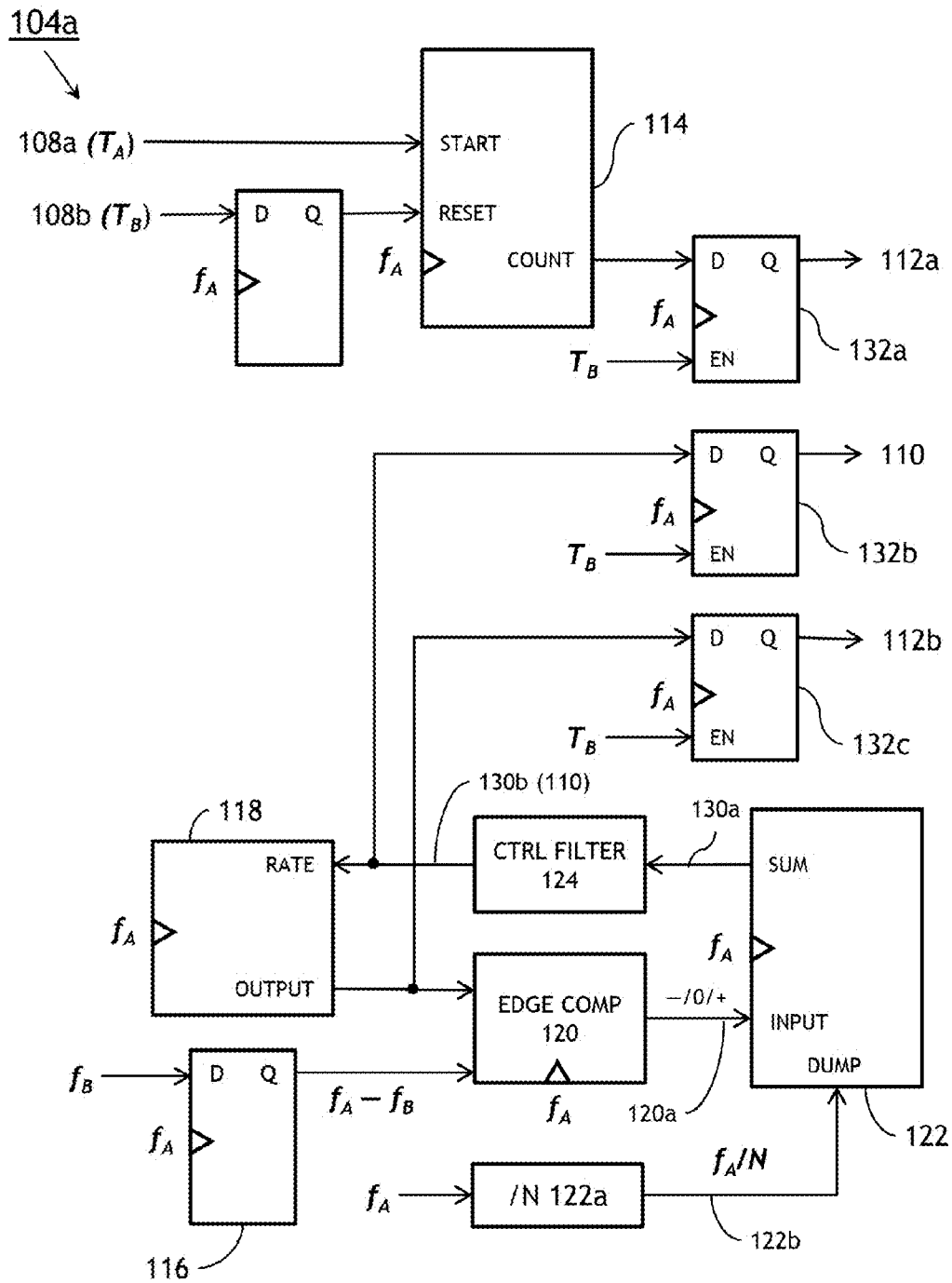
FIG. 2D illustrates an exemplary digital embodiment of the system of FIG. 2C according to the inventive concepts disclosed herein.

Referring now to FIG. 2D, an exemplary digital embodiment of the PTFE 104a according to the inventive concepts disclosed herein is implemented similarly to the PTFE 104 (FIG. 2B), except that the PTFE 104a includes integer ambiguity resolution logic incorporating time mark signals 108a-b from each sensor 102a-b and latches 132a-c for sampling generated information at known times. The time mark signals 108a-b may be aligned with their respective originating sensors 102a-b to indicate which edge of the respective clock signal 108a-b is aligned with a particular absolute time of the originating sensor 102a-b. Latches 132a-c may sample the integer time difference 112a, the phase difference 112b, and the frequency difference 110 at each first edge of the reference clock signal 106a (at frequency $f_A$) after the measured time mark signal 108b ($T_B$). The latches 132a-c may sample generated data at any other predetermined time as determined by system requirements.

Figure 3A:
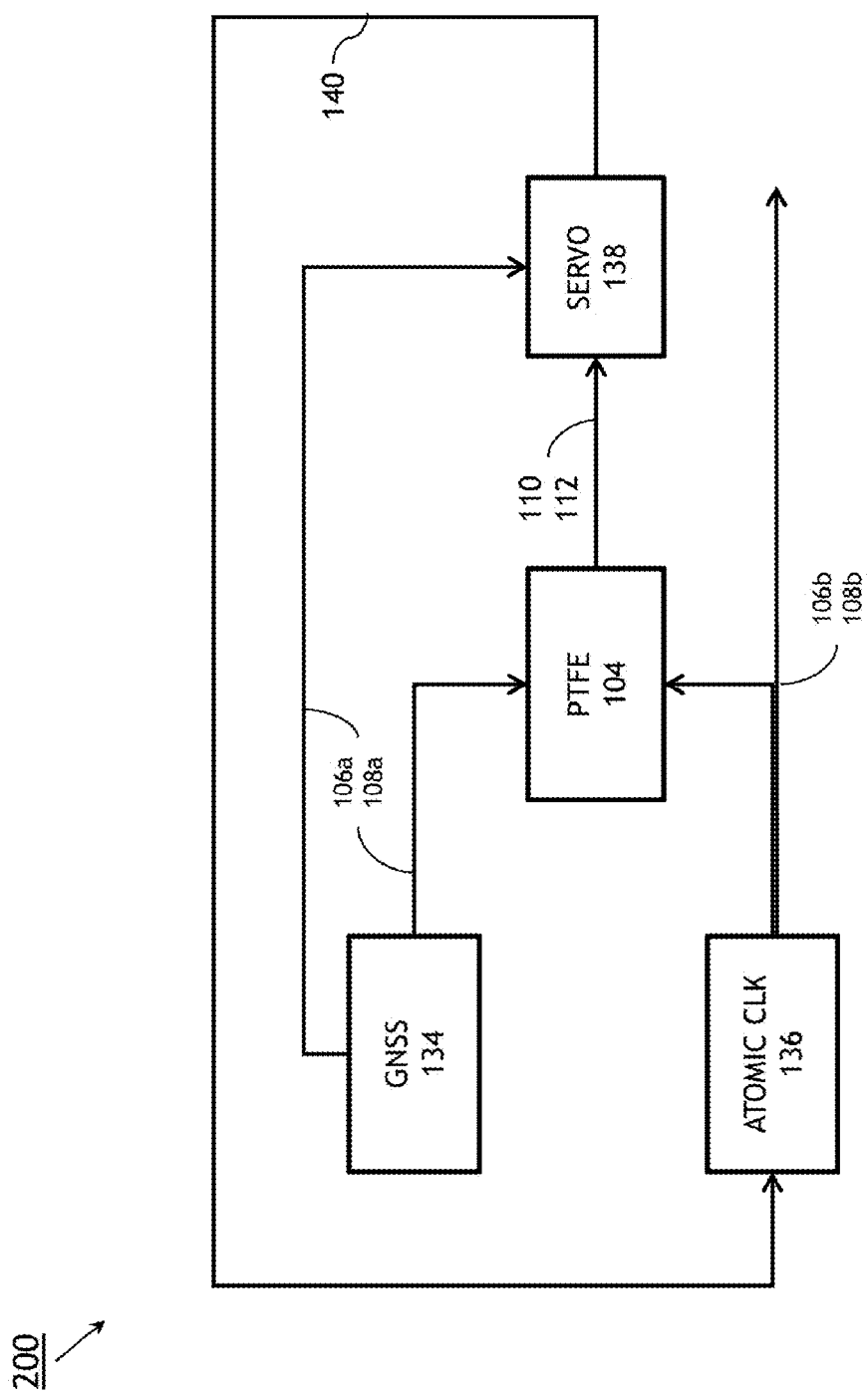
FIG. 3A illustrates an exemplary embodiment of a closed loop system according to the inventive concepts disclosed herein.

Referring now to FIG. 3A, an exemplary embodiment of a system 200 according to the inventive concepts disclosed herein may include a global navigation satellite system (GNSS) receiver 134, an atomic clock 136, a PTFE 104, and a servo (offset module) 138. An atomic clock 136 may perform with desirable frequency and time stability such that the atomic clock 136 may provide time and frequency information to other sensors within the system 200. However, to serve as an absolute time reference, the atomic clock 136 must be initialized to a GNSS receiver 134 or similar absolute time reference. The system 200 may utilize a PTFE 104 to quickly and accurately synchronize the atomic clock 136 to the absolute time sensed by the GNSS receiver 134. The PTFE may receive the reference clock signal 106a and reference time mark signal 108a from the GNSS receiver 134 and a measured clock signal 106b and measured time mark signal 108b from the atomic clock 136, determining the frequency difference 110 and time difference 112 of the atomic clock 136 relative to the GNSS receiver 134. The system 200 may use a servo 138 to provide clock correction data 140 to the atomic clock 136, the clock correction data 140 based on the determined frequency difference 110 and time difference 112. Based on the received clock correction data 140, the atomic clock 136 may correct the measured clock signal 106b and measured time mark signal 108b to match the reference clock signal 106a and reference time mark signal 108a of the GNSS receiver 134.

Figure 3B:
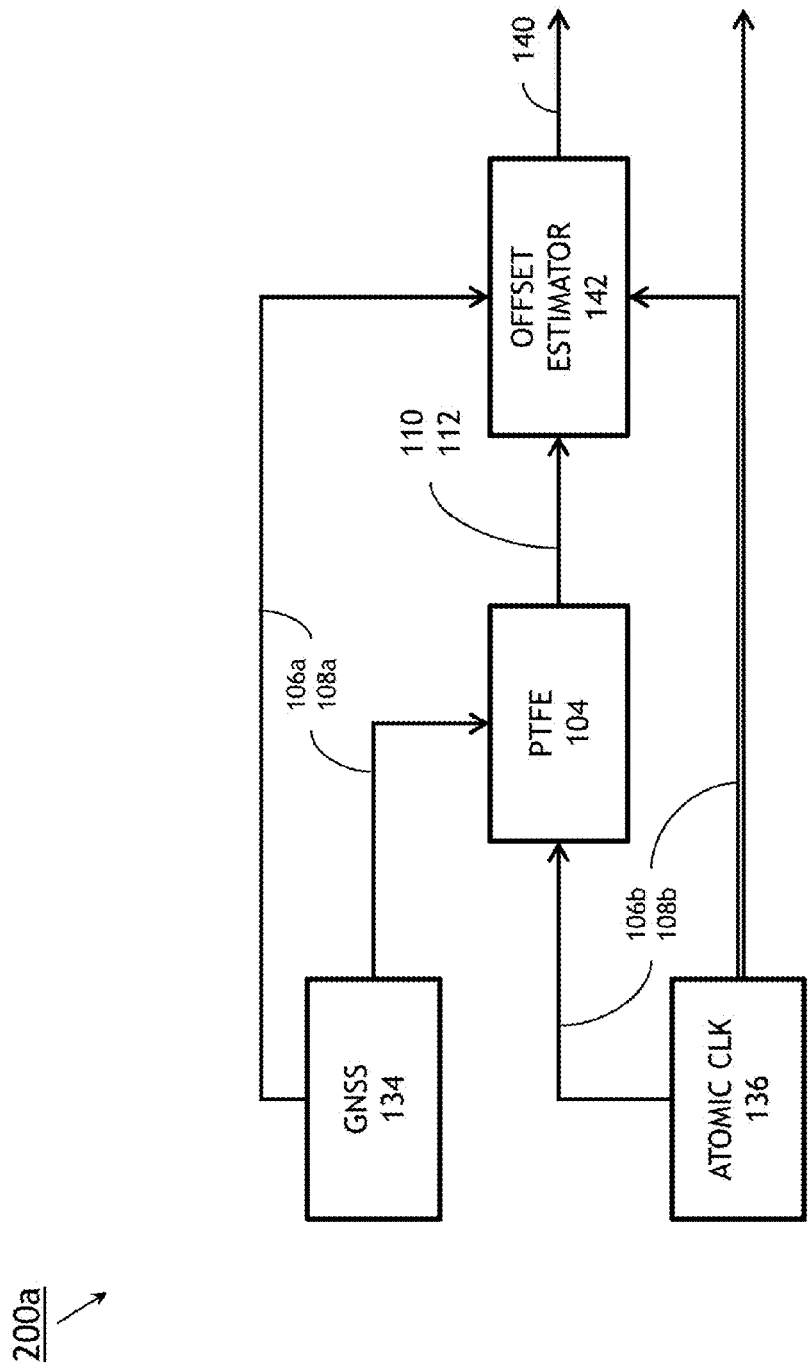
FIG. 3B illustrates an exemplary embodiment of the system of FIG. 3A according to the inventive concepts disclosed herein.

Referring to FIG. 3B, an exemplary embodiment of a system 200a according to the inventive concepts disclosed herein is implemented similarly to the system 200 (FIG. 3A), except that the system 200a incorporates an offset estimator 142 in place of the servo 138 (FIG. 3A). The atomic clock 136 may not provide suitable inputs to allow for correction, or the design of the system 200a may provide for the preservation of data integrity by operating the atomic clock 136 independently of the GNSS receiver 134. When a clock signal 106a and a time mark signal 108a are available from the GNSS receiver 134, the offset estimator 142 may receive the frequency difference 110 and time difference 112 determined by the PTFE 104 and estimate the time and frequency offset of the atomic clock 136 relative to the GNSS receiver 134 (e.g., clock correction data 140). If timing data is unavailable from the GNSS receiver 134 (e.g., the GNSS receiver 134 fails or is jammed/interfered with) the offset estimator 142 may provide clock correction data 140 based on frequency differences 110 and time differences 112 previously measured by the PTFE 104 and the output of the atomic clock 136 (e.g., the measured clock signal 106b and measured time mark signal 108b).

Figure 3C:
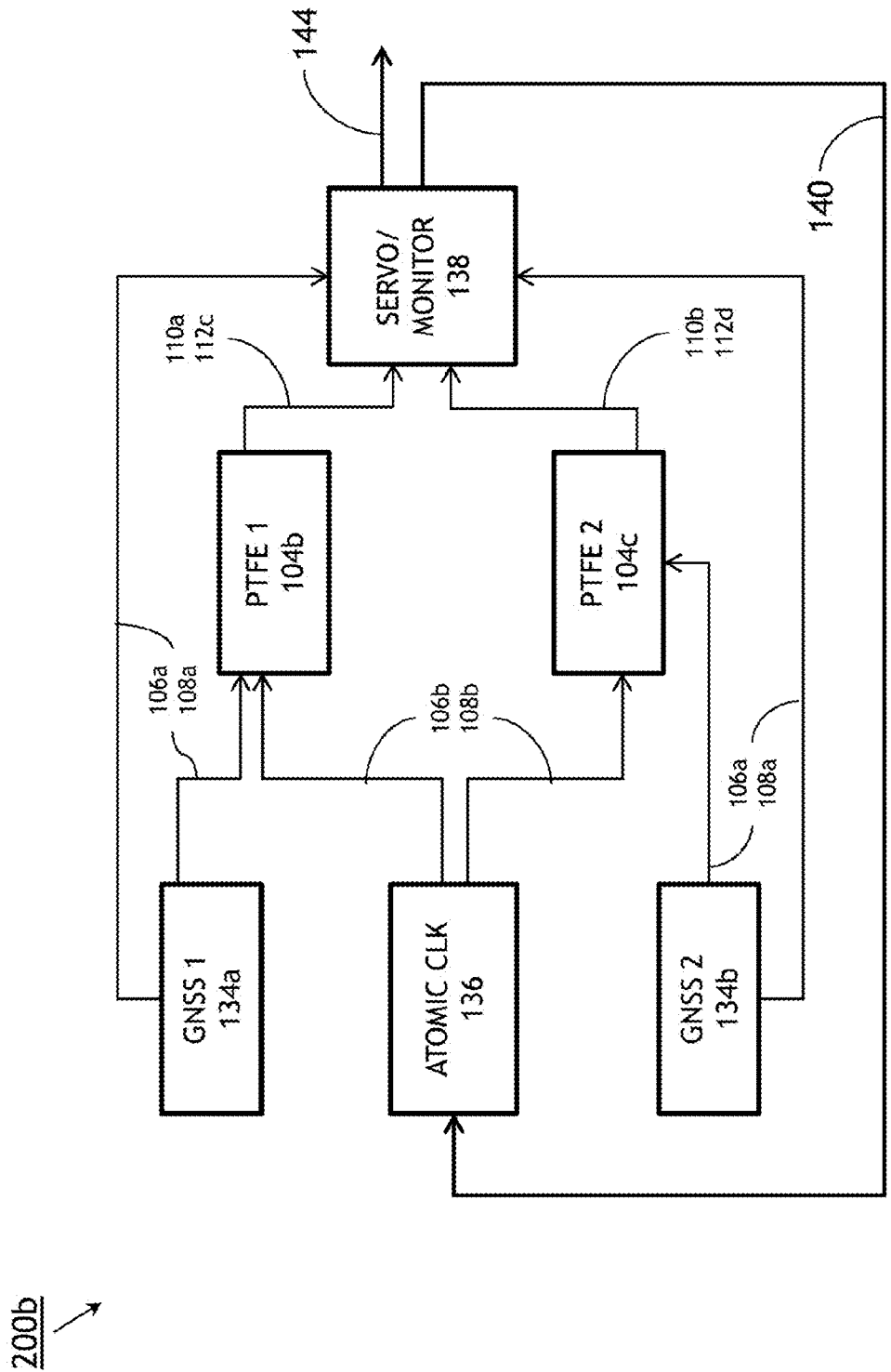
FIG. 3C illustrates an exemplary embodiment of the system of FIG. 3A according to the inventive concepts disclosed herein.

Referring to FIG. 3C, an exemplary embodiment of a high-integrity system 200b according to the inventive concepts disclosed herein is implemented similarly to the system 200 (FIG. 3A), except that the system 200b incorporates multiple GNSS receivers 134a-b and multiple PTFEs 104b-c to correct the atomic clock 136 with high integrity. For example, the atomic clock 136 may be initialized and used to detect timing faults in the GNSS receiver 134a-b. The use of the system 200b incorporating multiple PTFEs 104b-c may allow timing faults to be detected more quickly than via conventional approaches. The time difference 112c and frequency difference 110a between the atomic clock 136 and a first GNSS receiver 134a may be measured by a first PTFE 104b, and the time difference 112d and frequency difference 110b between the atomic clock 136 and a second GNSS receiver 134b may be measured by a second PTFE 104c. The output of each PTFE 104b-c (time differences 112c-d and frequency differences 110a-b) may be corrected with the respective clock signal 106a and time mark signal 108a of each GNSS receiver 134a-b and the consistency of each time difference 112c-d and frequency difference 110a-b computed by a monitor of the servo 138, resulting in GNSS integrity data 144 output from the servo 138. If the time differences 112c-d and frequency differences 110a-b are consistent with each other, the resulting clock correction data 140 may be applied to the atomic clock 136, correcting the clock signal 106b and time mark signal 108b generated by the atomic clock 136. If the time differences 112c-d and frequency differences 110a-b are not consistent with expected variations (based on, e.g., the performance of the GNSS receivers 134a-b), the GNSS receiver 134a-b most inconsistent with the atomic clock 136 may be flagged as faulty and excluded from use with vehicle systems. In addition, the atomic clock 136 or its corrected output (clock signal 106b and time mark signal 108b) may be flagged as faulty and not used. For example, if the atomic clock 136 is inoperative (e.g., fails), the servo 138 will be unable to correct the atomic clock 136 to match the GNSS receivers 134a-b. Similarly, if the atomic clock 136 is unstable (e.g., subject to excessive drift), the servo 138 may correct the atomic clock 136 so frequently as to be inconsistent with the expected stability of the atomic clock 136. In these cases, the system 200b may declare itself unmonitored; for example, the system 200b may be able to identify that the outputs of the GNSS receivers 134a-b disagree, but may not be able to identify which GNSS receiver 134a-b is at fault without the use of a third GNSS receiver (not shown) to directly compare the outputs (the reference clock signals 106a and the reference time mark signals 108a) of each GNSS receiver 134a-b. In addition, if all signals from the GNSS receivers 134a-b are lost due to interference or jamming (leaving the system to "coast" on timing information from the atomic clock 136 or inferences of the timing information from the GNSS receivers 134a-b), the system 200b may not deliver the specified performance.

Figure 4A:
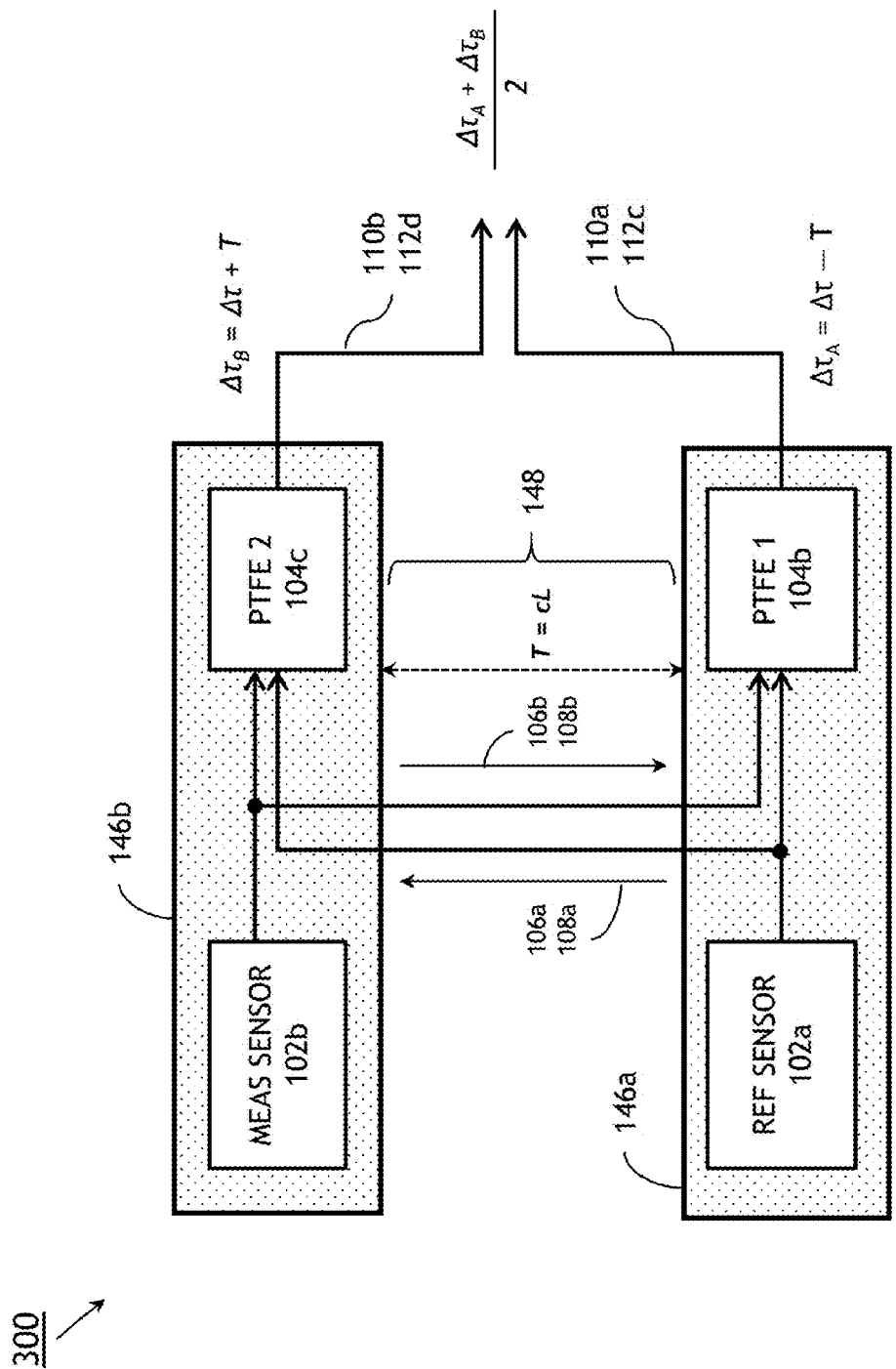
FIG. 4A illustrates an exemplary embodiment of a precision time/frequency interface according to the inventive concepts disclosed herein.

Referring now to FIG. 4A, an exemplary embodiment of a precision time/frequency interface (PTFI) system 300 according to the inventive concepts disclosed herein may include two subsystems 146a-b, each subsystem 146a-b including a sensor (e.g., reference sensor 102a and measured sensor 102b) and a PTFE 104b-c connected to each sensor 102a-b. The two subsystems 146a-b may be connected by a cable 148 of unknown length (such that an unknown propagation delay T is associated with the cable length); clock signals 106a-b and time mark signals 108a-b may be fed in both directions along the cable 148 between the subsystems 146a-b. The cable 148 may be a single cable bundle including two sets of twisted shielded pairs, coaxial cables, or fiber optic cables of equal length, each individual cable carrying signals unidirectionally (e.g., from the subsystem 146a to the subsystem 146b). In addition, due to the low bandwidth requirements of the PTFE 104c-d, the cable 148 may be a single copper or fiber optic cable configured for time domain multiplexing (TDM) or frequency division multiplexing of signals in both directions, or the cable 148 may be a wireless connection. The low data rate required enables the use of low cost, low modulation laser diodes or light emitting diodes (LED). Different wavelengths may be used for different directions to minimize back reflection, although the ability of the PTFE 104b-c to effectively average many measurements of clock edges may enable the use of a single RF frequency or optical wavelength in both directions. Both PTFEs 104b-c of the system 300 may output a frequency difference 110a-b and a time difference 112c-d between the reference sensor 102a and the measured sensor 102b by comparing the respective clock signals 106a-b and time mark signals 108a-b, both outputs accounting for the propagation delay T=cL (where Δτ is the difference in clock bias between the reference sensor 102a and the measured sensor 102b, L is the length of the cable 148, and c is the speed of light). From these difference outputs 110a-b, 112c-d the relative time of the sensors 102a-b and the propagation delay T may be determined.

Figure 4B:
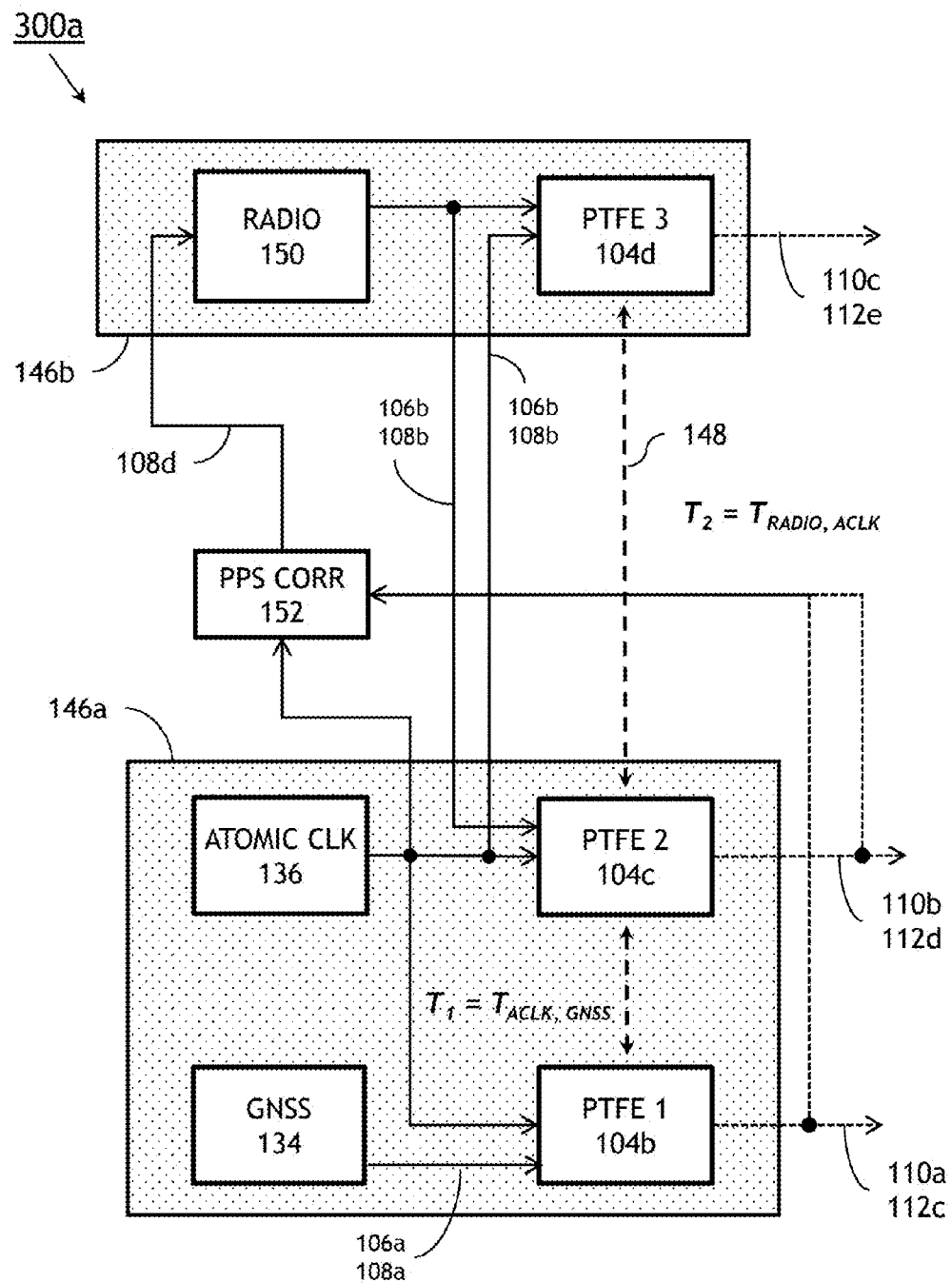
FIG. 4B illustrates an exemplary embodiment of the system of FIG. 4A including a remote device according to the inventive concepts disclosed herein.

Referring now to FIG. 4B, an exemplary embodiment of a system 300a according to the inventive concepts disclosed herein is implemented similarly to the PTFI system 300 (FIG. 4A), except that the system 300a incorporates a subsystem 146a including a GNSS receiver 134, an atomic clock 136, and PTFEs 104b-c; a subsystem 146b remotely located from the subsystem 146a and including a radio or similar communications device 150 and a remote PTFE 104d; and a pulse per second (PPS) correction block 152. The atomic clock 136 may be a chip-scale atomic clock (CSAC). The radio 150 may require a GNSS-referenced time mark signal 108d (which approximates the reference time mark signal 108a (FIGS. 3A-3C) generated by the GNSS receiver 134) to maintain communications functions. The phase of the GNSS-referenced time mark signal 108d is not important, but approximate time accuracy of the GNSS-referenced time mark signal 108d must be maintained for an extended duration should signals from the GNSS receiver 134 be unavailable. In addition, any RF surveillance data collected by the radio 150 must be precisely time-tagged. Therefore the frequency and time of the internal sensors or clocks of the radio 150 must be measured precisely relative to the reference clock signal 108a and reference time mark signal 108b (FIGS. 3A-3C) generated by the GNSS receiver 134, correcting for a propagation delay $T_2$ based on the unknown length of the cable 148 connecting the subsystems 146a-b (as opposed to the propagation delay $T_1$ within the subsystem 146a and between the GNSS receiver 134 and the atomic clock 136, which propagation delay $T_1$ is short, fixed, and known).

The use of the atomic clock 136 to drive timing of surveillance data collected by the radio 150 may allow for loss of signal from the GNSS receiver 134. The atomic clock 136 as shown by FIG. 4B may free-run (e.g., the atomic clock 136 is not served to the GNSS receiver 134) and the PTFE 104b may measure the time difference 112c and frequency difference 110a of the atomic clock 136 relative to the reference time of the GNSS receiver 134. Based on the time difference 112c and frequency difference 110a determined by the PTFE 104b, future time and frequency offsets of the atomic clock 136 relative to the GNSS receiver 134 may be predicted in the event of loss of signal from the GNSS receiver 134. The PTFEs 104c-d may determine the time difference 112d-e and frequency difference 110b-c of the radio 150 relative to the atomic clock 136 as well as the propagation delay $T_2$ between the subsystems 146a-b, based on the bidirectional exchange of clock signals 106b and time mark signals 108b between the atomic clock 136 (and its connected PTFE 104b) and the radio 150 (and its remote PTFE 104d). The PTFEs 104c-d may correct the determined time difference 112d-e and frequency difference 110b-c based on the determined propagation delay $T_2$. Given the projected accuracy of estimating both the time difference 112d-e between two clock sources (<10 ps) and the frequency difference 110b-c between two frequency sources (0.1 ppb), RF surveillance data collected by the radio 150 may be precisely timed to the absolute time and frequency of the GNSS receiver 134, thereby allowing multiple such systems 300a to collaborate in the geolocation of signal sources.

Figure 5:
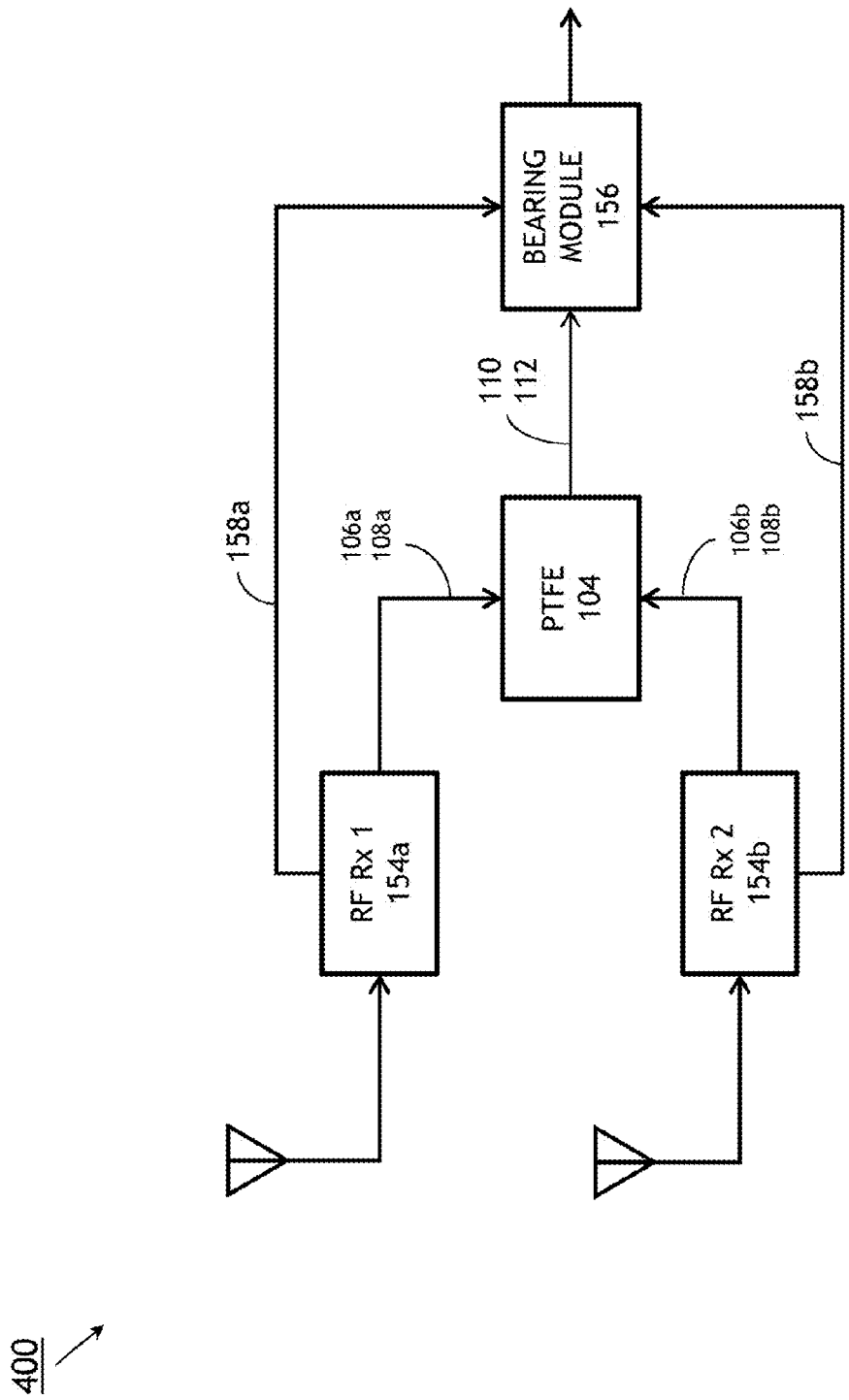
FIG. 5 illustrates an exemplary embodiment of a signal bearing determination system according to the inventive concepts disclosed herein.

Referring now to FIG. 5, an exemplary embodiment of a system 400 according to the inventive concepts disclosed herein may include two RF signal receivers 154a-b, a PTFE 104, and a bearing module 156. The PTFE 104 may determine the time difference 110 and frequency difference 112 between the receiver systems 154a-b based on the clock signals 106a-b and time mark signals 108a-b generated by the internal sensors of each receiver 154a-b. The bearing module 156 may then determine a bearing to the RF source of any signals received by the RF signal receivers 154*a-b* based on the determined time difference 110, the determined frequency difference 112, and arrival times 158*a-b* of the RF signals logged by the RF signal receivers 154*a-b* and forwarded to the bearing module 156.

Figure 6A:
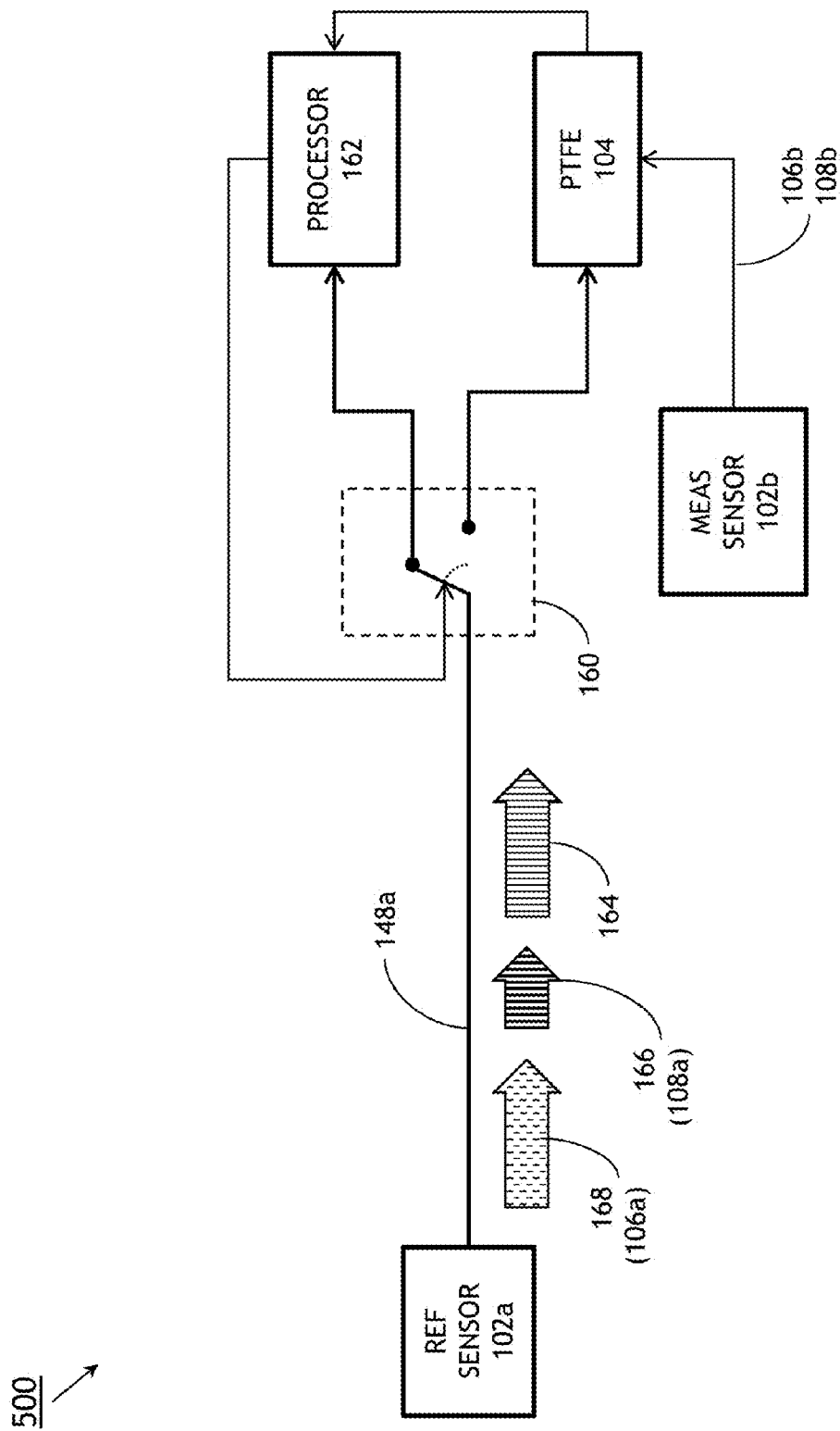
FIG. 6A illustrates an exemplary embodiment of an integrated system according to the inventive concepts disclosed herein.

Referring now to FIG. 6A, an exemplary embodiment of an integrated system 500 according to the inventive concepts disclosed herein may include a reference sensor 102*a* connected to an integrated communications channel 148*a*, a measured sensor 102*b*, a PTFE 104, and a receiver switch 160 connecting the integrated communications channel 148*a* to a processor 162. The integrated communications channel 148*a* may carry (from the reference sensor 102*a* to the PTFE 104 and processor 162) sensor data 164; time mark information 166 associated with the reference time mark signal 108*a*, and a clock burst 168 associated with the reference clock signal 106*a*. In implementations of the system 500, the reference clock signal 106*a* and reference time mark signal 108*a* generated by the reference sensor 102*a* may either be directly connected to the PTFE 104 or driven over longer distances. However, the long distances and corresponding weight of the necessary wiring, or the desire to use available legacy wiring, may lead to integration of the reference time mark signal 108*a* or reference clock signal 106*a* into the communications channel 148*a*.

The integrated communications channel 148*a* may be a twisted pair of copper cables, a coaxial or fiber optic cable, acoustic channel, or line of sight optical or radio frequency. The system 500 may manage the transmission of multiple signals via the integrated communications channel 148*a* by modulating the reference clock signal 106*a*. For example, any detectable modulation discernible from the normal oscillation of the reference sensor 102*a*, and compatible with the bandwidth of the integrated communications channel 148*a*, may be used (e.g., a phase reversal or on/off modulation). The measured sensor 102*b* may be a dissimilar clock generating a clock signal 106*b* at a frequency $f_B$ dissimilar to the frequency $f_A$ of the reference clock signal 106*a*.

The system 500 may be installed within a device in which the processor 160 may utilize other data from the reference sensor 102*a*. Therefore, the stream of sensor data 164 from the reference sensor 102*a* may also be integrated into the communications channel 148*a*, which may use time domain multiplexing (TDM) to manage the transmission of sensor data 164, the reference clock signal 106*a*, and the reference time mark signal 108*a* to the PTFE 104 and processor 162 (e.g., via a standard processor universal asynchronous receiver/transmitter (UART)). For example, the processor 162 may operate normally, receiving streaming sensor data 164 via the integrated communications channel 148*a*. When the processor 162 receives a segment of time mark information 166, however, the processor 162 may activate a receiver switch 160 to connect the integrated communications channel 148*a* to the PTFE 104. The PTFE 104 may receive a clock burst 168, which may be a brief (e.g., 1 ms) burst of clock data (e.g., a 10 MHz square wave) associated with the reference clock signal 106*a*. The measured time mark signal 108*b* may be triggered by the first edge of the clock burst 168 and (within the PTFE 104) the error accumulator 122 (FIG. 2A) may collect errors based on edge predictions by the NCO 118 (FIG. 2A) during the burst period.

Figure 6B:
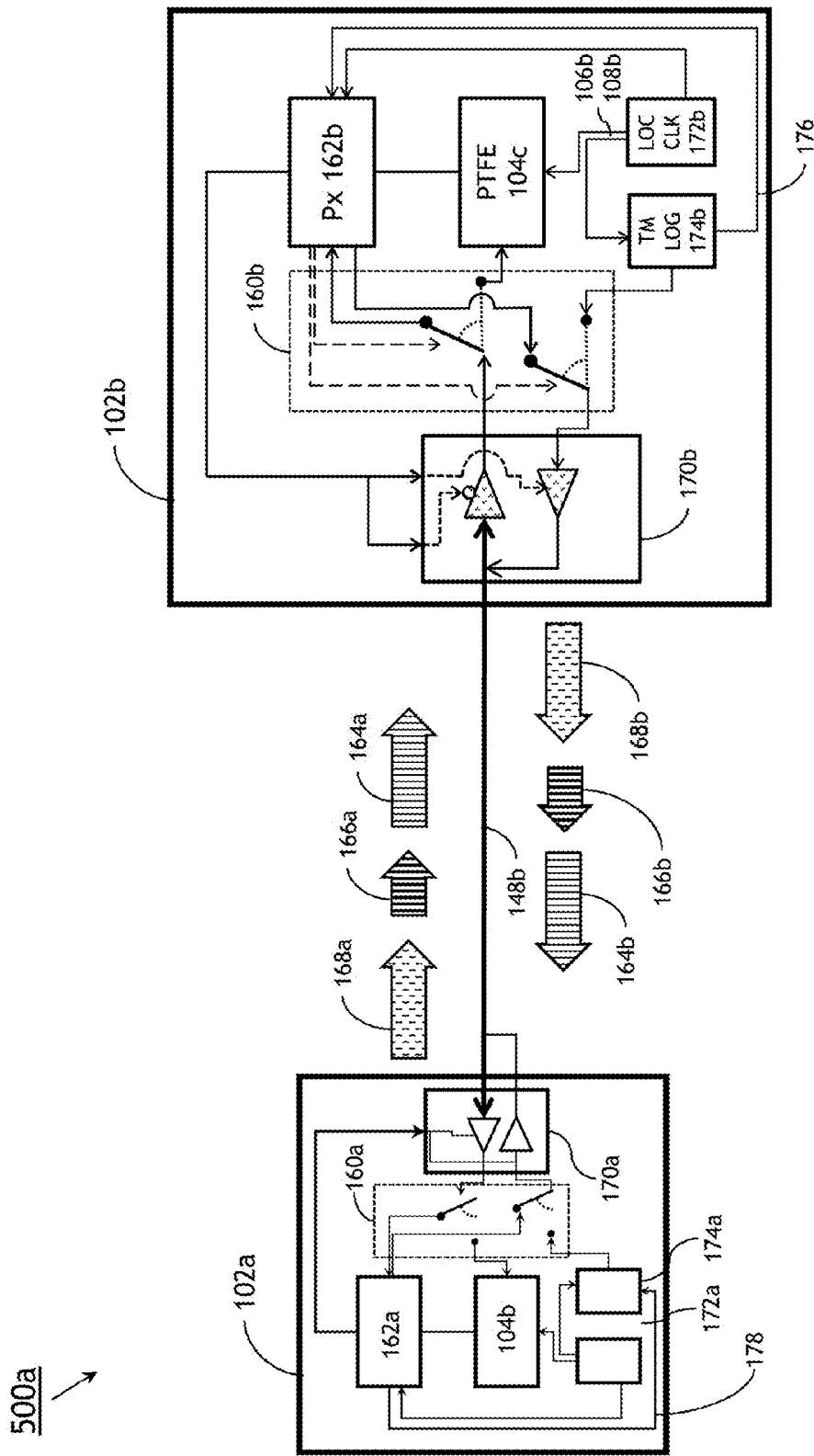
FIG. 6B illustrates an exemplary embodiment of the system of FIG. 6A according to the inventive concepts disclosed herein.

Referring now to FIG. 6B, an exemplary embodiment of a system 500*a* according to the inventive concepts disclosed herein is implemented similarly to the system 500 (FIG. 6A), except that the system 500*a* incorporates two sensors 102*a-b*, the two sensors 102*a-b* connected by a bidirectional channel 148*b* (e.g., a half duplex channel), each sensor 102*a* incorporating a PTFE 104*b-c*, a processor 162*a-b*, a transceiver 170*a-b* connected to either end of the bidirectional channel 148*b*, a local clock 172*a-b*, and a time mark logic module 174*a-b*. Use of a single bidirectional communications channel 148*b* for exchanging timing information between two sensors 102*a-b* may save the cost and weight of additional wiring or fiber optic cabling, and may allow the length of the single cable in which the bidirectional channel 148*b* is embodied (and the associated propagation delay) to be precisely calibrated. The local PTFEs 104*b-c* may be integrated into their respective sensors 102*a-b*. Each sensor 102*a-b* includes a local clock 172*a-b* for generating the clock signals 106*a-b* and time mark signals 108*a-b*. The time mark logic module 174*a-b* may generate an interrupt strobe (176) to the processor 162*a-b* to signal an imminent time mark signal 108*a-b*; the processor 160*a-b* may respond by signaling (178) transmission of the next clock burst 168*a-b*. The sensors 102*a-b* may coordinate use of the bidirectional channel 148*b* according to any common coordination techniques. For example, one sensor 102*a* may be designated as a "leader" and the other sensor 102*b* as a "follower". The "leader" sensor 102*a* may then transmit (via transceiver 170*a*) sensor data 164*a*, time mark information 166*a*, and the clock burst 168*a*, and notify the "follower" sensor 102*b* to commence transmission. Upon receiving the time mark information 166*a*, the "follower" sensor 102*b* may connect the PTFE 104*c* to the transceiver 170*b* (via transmit/receive switch 160*b*) so that the PTFE 104*c* may receive the clock burst 168*a*. The processors 162*a-b* may use other means of triggering the transmit/receive switches 160*a-b* to connect the PTFEs 104*b-c* to the transceivers 170*a-b* for the receipt of clock bursts 168*a-b* (and to reconnect the processors 162*a-b* to the transceivers 170*a-b* for the receipt of sensor data 164*a-b*), such that the transmitted time mark information 166*a-b* need not proceed the transmission of the clock burst 168*a-b*. For example, time mark information 166*b* may trail the clock burst 168*b*. The "leader" sensor 102*a* may adjust the rate at which the "follower" sensor 102*b* is allowed to transmit clock bursts 168*b*, or the "follower" sensor 102*b* may request the "leader" sensor 102*a* to adjust its rate of transmitting clock bursts 168*a*, depending on, e.g., performance or channel utilization considerations. Implementations of the system 500*a* may include any combination of more than one "leader" sensor 102*a* and more than one "follower" sensor 102*b* connected by the bidirectional channel 148*b*. For example, the "leader" sensors 102*a* and "follower" sensors 102*b* may include multiple implementations of the PTFE 104*b-c*, for determining relative time and frequency differences between a "follower" sensor 102*b* relative to a "leader" sensor 102*a* (or relative time and frequency differences between a "follower" sensor 102*b* and one or more other "follower" sensors 102*b*).

Figure 7A:
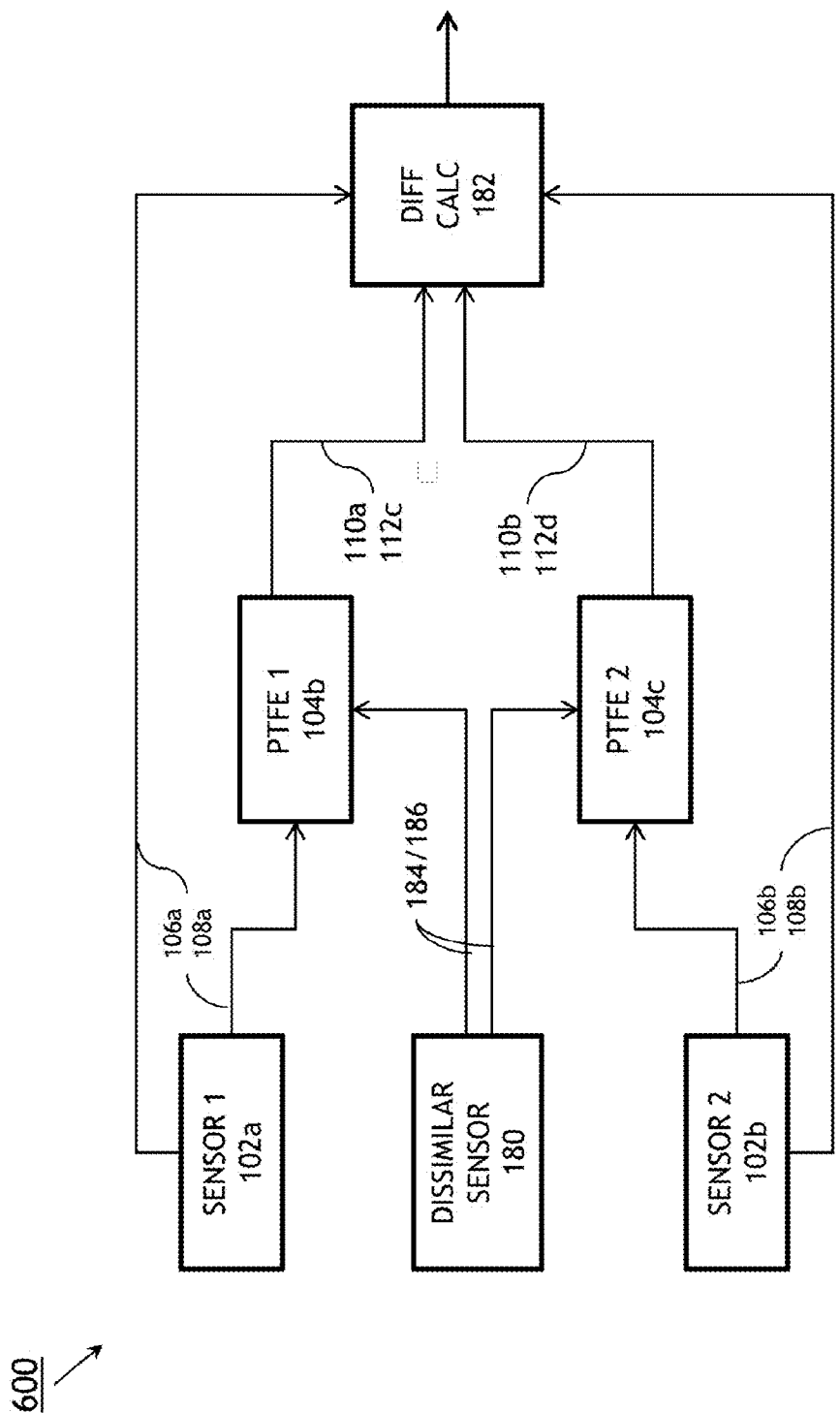
FIG. 7A illustrates an exemplary embodiment of an integrated system according to the inventive concepts disclosed herein.

Referring now to FIG. 7A, an exemplary embodiment of a system 600 according to the inventive concepts disclosed herein may include two sensors 102*a-b*, a dissimilar sensor 180, two PTFEs 104*b-c*, and a difference calculator (difference module) 182. If the reference clock signals 106*a-b* generated by each sensor 102*a-b* of a system are of a common clock frequency (e.g., substantially similar signals of 10 MHz), sample times may correspond with clock transitions and quantization errors may not be as quickly or as effectively reduced. The dissimilar sensor 180 may generate a clock signal 184 of substantially dissimilar frequency (or incoherent phase) with respect to the common clock frequency (or phase) of the clock signals 106a-b generated by the sensors 102a-b; the dissimilar sensor 180 may generate a time mark signal 186. The system 600 may be a dual-PTFE implementation (e.g., PTFEs 104b-c) to measure two sensors 102a-b whose clock signals 106a-b are of substantially similar frequency (e.g., a left-side and right-side aircraft GNSS receiver). For example, the PTFE 104b may determine a frequency difference 110a and a time difference 112c of the sensor 102a relative to the dissimilar sensor 180, and the PTFE 104c may determine a frequency difference 110b and a time difference 112d of the sensor 102b relative to the dissimilar sensor 180. The difference calculator 182 may difference the time differences 112c-d and frequency differences 110a-b output by the respective PTFEs 104b-c, incorporating absolute timing information (reference clock signals 106a-b and time mark signals 108a-b) from each sensor 102a-b to determine the relative time frames of the sensors 102a-b. Unlike prior art DDMTD systems, implementations of the system 600 are free of the requirement for closely syntonized frequencies between clock signals 106a-b or time mark signals 108a-b generated by the sensors 102a-b. The frequencies of the clock signals 106a-b or time mark signals 108a-b may cross through or vary independently of each other without affecting the performance of the system 600.

Figure 7B:
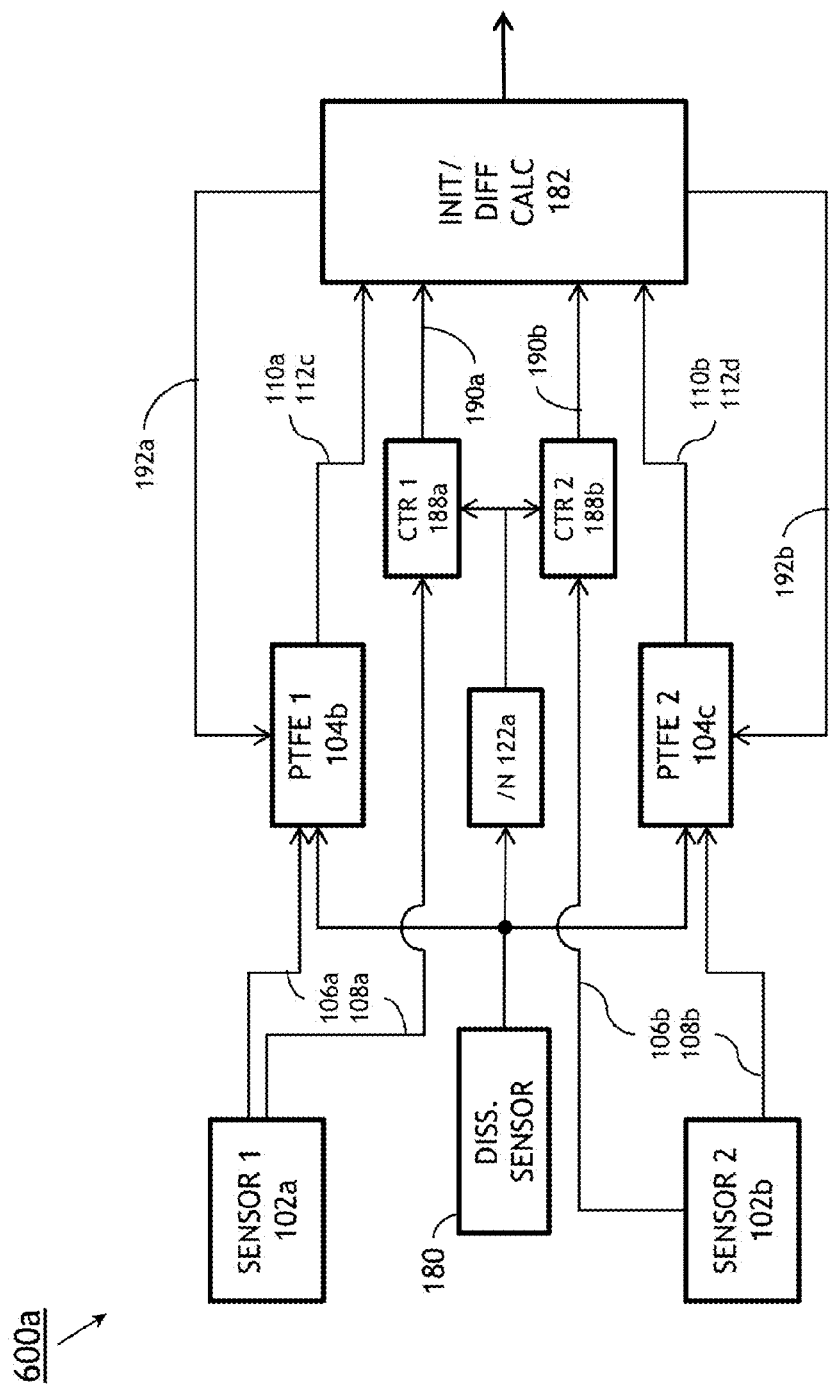
FIG. 7B illustrates an exemplary embodiment of the system of FIG. 7A according to the inventive concepts disclosed herein.

Referring now to FIG. 7B, an exemplary embodiment of a system 600a according to the inventive concepts disclosed herein is implemented similarly to the system 600 (FIG. 7A), except that the system 600a includes counters 188a-b for approximating the frequencies of the clock signals 106a-b generated by the sensors 102a-b prior to initialization of the PTFEs 104b-c. The NCOs 118 (FIG. 2B) of each PTFE 104b-c must be initialized with a value as close as possible to the frequency difference 110a-b ($f_A$-$f_B$) of the sensors 102a-b, which may be programmed based on a relatively accurate estimate of the frequencies of any other clock signals 106a-b within the system, or by information exchanged between sensors 102a-b. In some implementations, however, the PTFEs 104b-c may not have access to initialization information. Therefore the system 600a may include counters 188a-b for determining approximate clock signal frequencies 190a-b (per N cycles, as determined by the divider 122a) that may be used by the difference calculator 182 to determine an approximate, but unambiguous, frequency offset (e.g., an estimate of the frequency difference 110a-b) between the clock signals 106a-b of the sensors 102a-b. The difference calculator 182 may provide the PTFEs 104b-c with initialization information 192a-b based on the approximate frequency offset 190a-b.

Figure 8A:
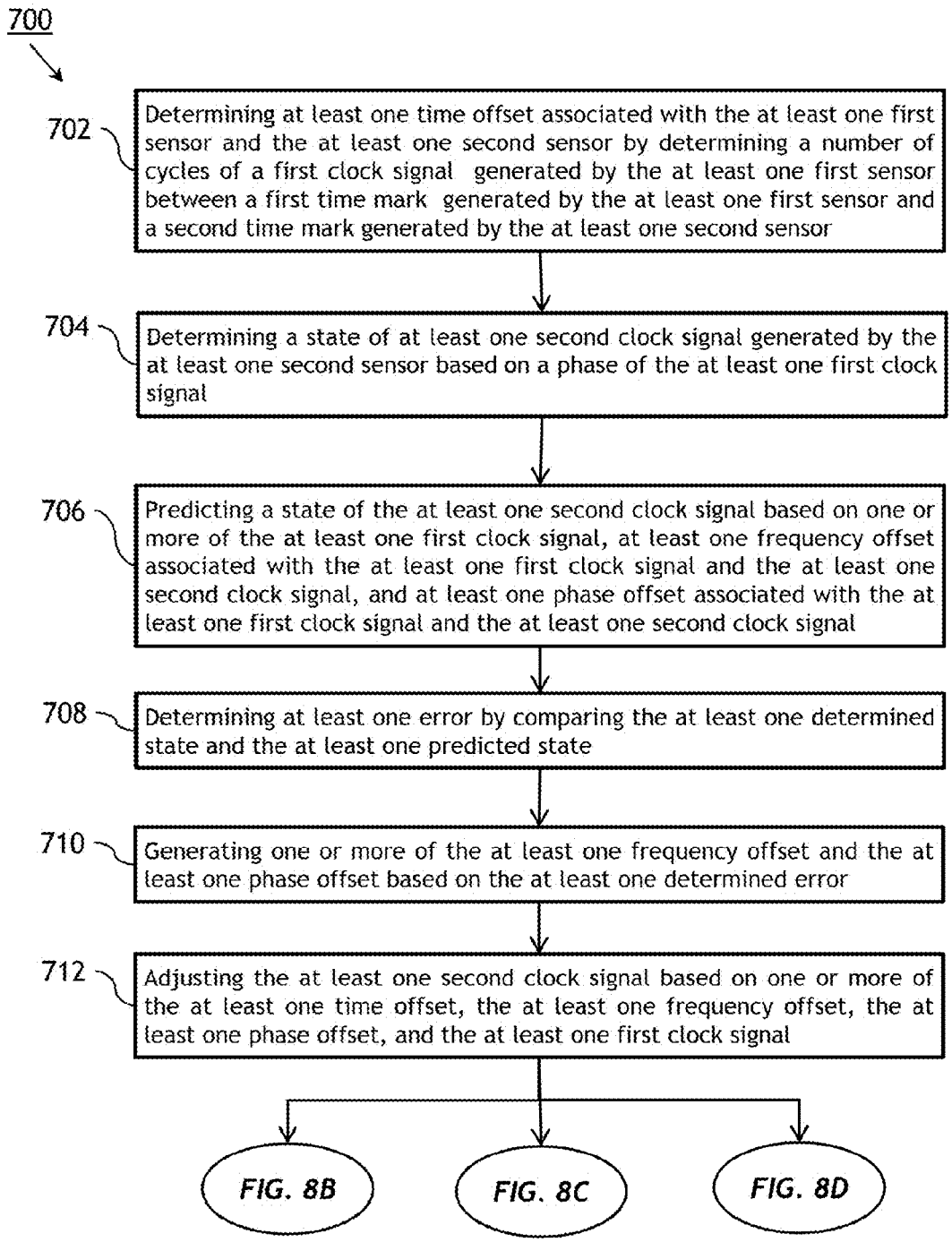

Referring now to FIG. 8A, an exemplary embodiment of a method 700 for synchronizing at least one sensor according to the inventive concepts disclosed herein may include one or more of the following steps. At a step 702, the method 700 determines, via an integer timer 114 of a precision time frequency estimator (PTFE) 104, at least one time difference 112a associated with a reference sensor 102a and a measured sensor 102b by determining a number of cycles of a reference clock signal 106a generated by the reference sensor 102a between a reference time mark 108a generated by the reference sensor 102a and a measured time mark 108b generated by the measured sensor 102b. For example, the at least one time difference 112a may be estimated based on a frequency difference 110 and the reference clock signal 106a. The PTFE 104 may determine a time difference 112a associated with either the reference sensor 102a or the measured sensor 102b and a dissimilar sensor 180 generating a clock signal 184 of substantially dissimilar frequency to the reference clock signal 106a and the measured clock signal 108a.

At a step 704, the method 700 determines, via a sampling subsystem 116 of the PTFE 104, a state 126 of the measured clock signal 106b generated by the measured sensor 102b based on a phase of the reference clock signal 106a. For example, the PTFE 104 may determine a state of the dissimilar clock signal 182 generated by the dissimilar sensor 178.

At a step 706, the method 700 predicts, via a numerically controlled oscillator (NCO) 118 of the PTFE 104, a state 128 of the measured clock signal 106b based on one or more of the reference clock signal 106a, a frequency difference 110 associated with the reference clock signal 106a and the measured clock signal 108a, and a phase difference 112b associated with the reference clock signal 106a and the measured clock signal 108a. For example, the PTFE 104 may predict a state 128 of the dissimilar clock signal 184 based on a frequency difference or a phase difference (130b) associated with the dissimilar clock signal 184 and either the reference clock signal 106a or the measured clock signal 106b.

At a step 708, the method 700 determines, via a state compare module 120 of the PTFE 104, at least one error 130 by comparing the determined state 126 of the measured clock signal 108a and the predicted state 128. The PTFE 104 may determine and accumulate errors 130 by comparing the determined and predicted states 126, 128 of the dissimilar clock signal 184.

At a step 710, the method 700 generates, via a control filter 124 of the PTFE 104, a corrected frequency difference and phase difference (130b) based on the accumulated determined errors 130a.

The method 700 may include an additional step 712. At the step 712, the method 700 adjusts the measured clock signal 108a based on one or more of the time difference 112a, the frequency difference 110, the phase difference 112b, and the reference clock signal 106a.

Figure 8B:
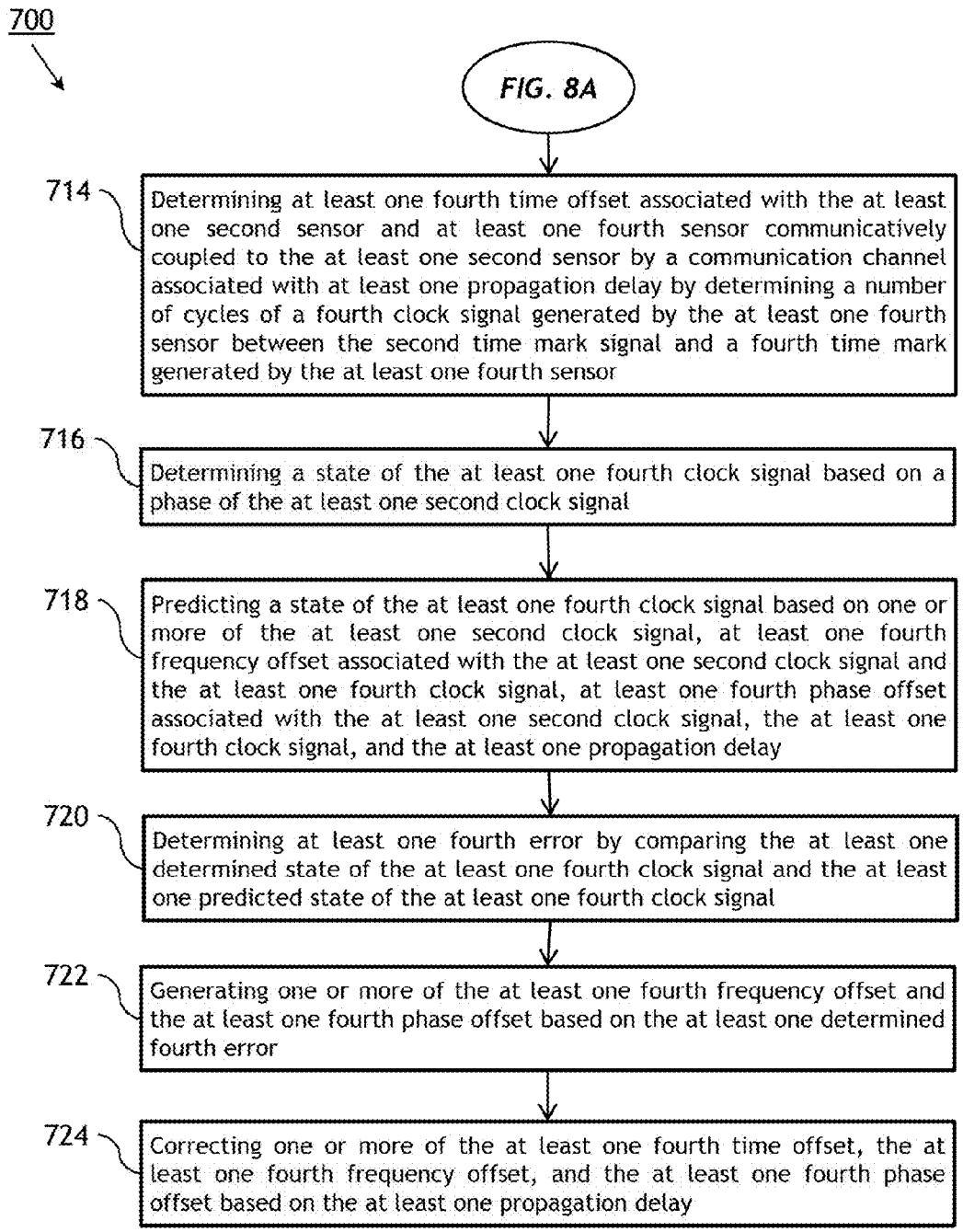

Referring now to FIG. 8B, the method 700 may include additional steps 714 through 724. At the step 714, the method 700 determines, via a PTFE 104c-d, a time offset 110c associated with an atomic clock 136 and a sensor of a radio 150 of a remote subsystem 146b, the remote subsystem 146b communicatively coupled to the atomic clock 136 by a communication channel 148 associated with a propagation delay $T_2$, by determining a number of cycles of a clock signal 106b generated by the sensor of the radio 150 between the second time mark signal 108b and a fourth time mark 108b generated by sensor of the radio 150.

At a step 716, the method 700 determines, via the PTFE 104c-d, a state of the at least one clock signal 106b of the radio 150 based on a phase of the clock signal 106b of the atomic clock 136.

At a step 718, the method 700 predicts, via the PTFE 104c-d, a state of the clock signal 106b of the radio 150 based on the clock signal 106b of the atomic clock 136, a frequency or phase offset (112e) associated with the clock signal 106b of the radio 150 and the clock signal 106b of the atomic clock 136, the clock signal 106b of the radio 150, and the propagation delay $T_2$.

At a step 720, the method 700 determines, via the PTFE 104c-d, an error by comparing the determined and predicted states of the clock signal 106b of the radio 150.

At a step 722, the method 700 generates, via the PTFE 104c-d, the frequency or phase offset (112e) based on the determined errors.

At the step 724, the method 700 corrects, via the PTFE 104c-d, the time offset 110c and frequency or phase offset (112e) based on the propagation delay $T_2$.

Referring now to FIG. 8C, the method 700 may include additional steps 726 through 736. At a step 726, the method 700 generates the reference clock signal 106a and the reference time mark signal 108a via a local clock 172a of the reference sensor 102a.

At a step 728, the method 700 sends the reference clock signal 106a and the reference time mark signal 108a to a PTFE 104 of the reference sensor 102a and a time logic module 174a of the reference sensor.

At steps 730 and 732, the method 700 generates an interrupt 176 associated with the reference time mark signal 108a and sends the interrupt 176 to a processor 162a of the reference sensor 102a via the time logic module 174a.

At a step 734, the processor 162a connects a transceiver 170a of the reference sensor 102a to the time logic module 174a.

At a step 736, the method 700 sends time mark information 166a associated with the reference time mark signal 108a or a clock burst 168a associated with the reference clock signal 106a from the time logic module 174a to the measured sensor 102b via the transceiver 170a.

Referring now to FIG. 8D, the method 700 may include additional steps 738 through 742. At a step 738, the method 700 receives the time mark information 164a via a transceiver 170b of the measured sensor 102b.

At a step 740, the method 700 connects a PTFE 104 of the measured sensor 102b to the transceiver 170b via a processor 162b of the measured sensor 102b.

At a step 742, the method 700 receives the clock burst 168a from the reference sensor 102a via the PTFE 104 of the measured sensor 102b.

As will be appreciated from the above, systems and methods according to embodiments of the inventive concepts disclosed herein may provide real time, high precision determination of time and frequency offsets (within 10 ps or 0.1 ppb respectively) for federated and distributed systems. Furthermore, the bandwidth demands of generating and transporting clock signals and time mark signals are lower than required by conventional approaches (e.g., RF frequencies of 10 MHz as opposed to very fast optical pulses, and lower-bandwidth legacy copper cabling as opposed to fiber-optic cabling. Timing synchronization and frequency syntonization may be simultaneously determined and tracked in real time with extreme precision, creating a virtual clock at each sensor tracking the difference with other sensor clocks. In addition, fast real-time tracking of relative clock phase and frequency variations allows the use of lower-cost or lower-precision quartz clocks in systems that do not otherwise need a precision clock. Such lower-cost, lower-stability quartz clocks may be continuously calibrated with respect to a highly stable clock, such that systemwide timing derives the benefit of the highly stable clock. PTFE functionality may be easily replicated multiple times within a federated architecture, and PTFE/PTFI systems according to embodiments of the inventive concepts disclosed herein may be efficiently digitally implemented and hosted on compact devices, utilizing existing processors and running alongside other applications.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

We claim:

1. A system for synchronizing at least one sensor, comprising:
   at least one first sensor configured to generate at least one first timing element including one or more of a) a first clock signal having a first frequency and b) a first time mark signal;
   at least one second sensor configured to generate at least one second timing element including one or more of a) a second clock signal having a second frequency and b) a second time mark signal; and
   at least one estimator communicatively coupled to one or more of the at least one first sensor and the at least one second sensor, the at least one estimator configured to determine at least one estimator output associated with the at least one first sensor and the at least one second sensor, the at least one estimator output including one or more of: a time difference between the first time mark signal and the second time mark signal; a frequency difference between the first frequency and the second frequency; and a phase difference of the second frequency relative to the first frequency; the at least one estimator including
      at least one sampler configured to determine at least one state of the second clock signal based on a phase of the first clock signal;
      at least one oscillator configured to predict at least one state of the second clock signal based on the first clock signal and one or more of the frequency difference and the phase difference;
      at least one state compare circuit configured to determine at least one error by comparing the at least one determined state and the at least one predicted state; and
      at least one control filter configured to a) generate the at least one frequency difference based on the at least one error, b) generate the at least one phase difference based on the at least one error, and c) send one or more of the at least one frequency difference and the at least one phase difference to the oscillator.

2. The system of claim 1, wherein the at least one estimator further comprises: at least one latch communicatively coupled to the control filter and configured to receive one or more of the time difference, the frequency difference, and the phase difference at a predetermined event time.

3. The system of claim 1, further comprising: at least one offset circuit communicatively coupled to the at least one estimator and configured to receive the at least one first timing element from the at least one first sensor; receive the at least one estimator output from the at least one estimator; and generate clock correction data based on one or more of the at least one received first timing element and the at least one received estimator output.

4. The system of claim 3, wherein the at least one offset circuit is further configured to provide the clock correction data to the at least one second sensor.

5. The system of claim 3, wherein: the at least one first sensor is embodied in a first receiver configured to receive at least one first RF signal from at least one RF source; the at least one second sensor is embodied in a second receiver configured to receive at least one second RF signal from the at least one RF source; and the at least one offset circuit is further configured to receive at least one first arrival time associated with the at least one first RF signal from the at least one first receiver; receive at least one second arrival time associated with the at least one second RF signal from the at least one second receiver; and determine a bearing to the at least one RF source based on one or more of the at least one first arrival time, the at least one second arrival time, and the at least one estimator output.

6. The system of claim 1, wherein the system is embodied in at least one of a field programmable gate array (FPGA) and an application specific integrated circuit (ASIC).

7. The system of claim 1, wherein the at least one estimator includes: at least one first estimator communicatively coupled to the at least one first sensor and configured to determine at least one first estimator output; and at least one second estimator communicatively coupled to the at least one second sensor and configured to determine at least one second estimator output.

8. The system of claim 7, further comprising: at least one communications device communicatively coupled to the at least one second estimator by a communication channel having a propagation delay, the at least one communications device including at least one third sensor configured to generate at least one third timing element including at least one of a third clock signal having a third frequency and a third time mark signal; at least one correction block configured to approximate the at least one first time mark signal associated with the first sensor and send the at least one approximated first time mark signal to the at least one communications device; and at least one third estimator communicatively coupled to the at least one communications device and to the second estimator via the communication channel; wherein a) the at least one first estimator is configured to receive the at least one second clock signal and the at least one second time mark signal from the at least one second sensor, b) the at least one second estimator is configured to receive the at least one first clock signal and the at least one first time mark signal from the at least one first sensor; and c) one or more of the at least one second estimator and the at least one third estimator is configured to 1) determine at least one third estimator output associated with the at least one second sensor and the at least one third sensor and 2) correct the at least one third estimator output based on one or more of the at least one approximated first time mark signal and the propagation delay.

9. The system of claim 7, further comprising: at least one fourth sensor configured to generate at least one fourth timing element including at least one of a fourth time mark and a fourth clock signal having a fourth frequency; and at least one difference circuit communicatively coupled to the first estimator and the second estimator, the at least one difference circuit configured to determine at least one difference output associated with the at least one first sensor and the at least one second sensor, the at least one difference output including one or more of the time difference, the frequency difference, and the phase difference and based on one or more of a) at least one fourth estimator output determined by the at least one first estimator, the at least one fourth estimator output associated with the at least one first sensor and the at least one fourth sensor; and b) at least one fifth estimator output determined by the at least one second estimator, the at least one fifth estimator output associated with the at least one second sensor and the at least one fourth sensor.

10. The system of claim 9, wherein the at least one difference circuit is further configured to:
receive the at least one first timing element from the at least one first sensor; receive the at least one second timing element from the at least one second sensor; and determine the at least one difference output based on at least one or more of the received at least one first timing element and the received at least one second timing element.

11. The system of claim 9, further comprising: at least one first counter coupled to the at least one difference circuit and to the at least one first sensor, the at least one first counter configured to estimate the at least one first timing element; at least one second counter coupled to the at least one difference circuit and to the at least one second sensor, the at least one second counter configured to estimate the at least one second timing element; wherein the at least one difference circuit is further configured to determine the at least one difference output based on at least one or more of the at least one estimated first timing element and the at least one estimated second timing element.

12. The system of claim 9, wherein: the first frequency is substantially equal to the second frequency; and the fourth frequency is not substantially equal to the first frequency or the second frequency.

13. The system of claim 7, wherein: the at least one first sensor incorporates the at least one first estimator and the at least one second sensor incorporates the at least one second estimator;
the at least one first sensor and the at least one second sensor are connected by a bidirectional communications channel; and each sensor of the at least one first sensor and the at least one second sensor includes at least one clock configured to generate the at least one first timing element or the at least one second timing element; at least one transceiver configured to transmit and receive, via the bidirectional communications channel, one or more of a) the at least one first time mark signal or the at least one second time mark signal and b) the at least one first clock signal or the at least one second clock signal; and at least one time logic circuit configured to a) receive the at least one first timing element or the at least one second timing element from the at least one clock and b) generate at least one interrupt associated with the at least one first time mark signal or the at least one second time mark; and at least one processor configured to receive the at least one interrupt from the at least one time logic module, the at least one processor including a) a receiver switch coupled to the at least one transceiver and configured to connect the at least one transceiver to the at least one estimator and b) a transmitter switch coupled to the at least one transceiver and configured to connect the at least one transceiver to the at least one time logic module.

14. A method for synchronizing at least one first sensor and at least one second sensor, the method comprising:
determining at least one time offset associated with the at least one first sensor and the at least one second sensor by determining a number of cycles of a first clock signal generated by the at least one first sensor between a first time mark signal generated by the at least one first sensor and a second time mark signal generated by the at least one second sensor;

determining a state of at least one second clock signal generated by the at least one second sensor based on a phase of the at least one first clock signal;

predicting a state of the at least one second clock signal based on one or more of the at least one first clock signal, at least one frequency offset associated with the at least one first clock signal and the at least one second clock signal, and at least one phase offset associated with the at least one first clock signal and the at least one second clock signal;

determining at least one error by comparing the at least one determined state and the at least one predicted state; and generating one or more of the at least one frequency offset and the at least one phase offset based on the at least one determined error.

15. The method of claim 14, further comprising: adjusting the at least one second clock signal based on one or more of the at least one time offset, the at least one frequency offset, the at least one phase offset, and the at least one first clock signal.

16. The method of claim 15, wherein: the at least one time offset is a first time offset, the at least one frequency offset is a first frequency offset, and the at least one error is a first error; determining at least one time offset associated with the at least one first sensor and the at least one second sensor by determining a number of cycles of a first clock signal generated by the at least one first sensor between a first time mark signal generated by the at least one first sensor and a second time mark signal generated by the at least one second sensor includes a) determining at least one second time offset associated with the at least one first sensor and at least one third sensor by determining a number of cycles of a third clock signal generated by the at least one third sensor between the first time mark signal and a third time mark signal generated by the at least one third sensor, and b) determining at least one third time offset associated with the at least one second sensor and the at least one third sensor by determining a number of cycles of the third clock signal between the second time mark signal and the third time mark signal; determining a state of at least one second clock signal generated by the at least one second sensor based on a phase of the at least one first clock signal includes a) determining a first state of the at least one third clock signal based on a phase of the at least one first clock signal and b) determining a second state of the at least one third clock signal based on a phase of the at least one second clock signal; predicting a state of the at least one second clock signal based on one or more of the at least one first clock signal, at least one frequency offset associated with the at least one first clock signal and the at least one second clock signal, and at least one phase offset associated with the at least one first clock signal and the at least one second clock signal includes a) predicting a third state of the at least one third clock signal based on one or more of the at least one first clock signal, at least one second frequency offset associated with the at least one first clock signal and the at least one third clock signal, and at least one second phase offset associated with the at least one first clock signal and the at least one third clock signal, and b) predicting a fourth state of the at least one third clock signal based on one or more of the at least one second clock signal, at least one third frequency offset associated with the at least one second clock signal and the at least one third clock signal, and at least one third phase offset associated with the at least one second clock signal and the at least one third clock signal; determining at least one error by comparing the at least one determined state and the at least one predicted state includes a) determining at least one second error by comparing the at least one determined first state and the at least one predicted third state, and b) determining at least one third error by comparing the at least one determined second state and the at least one predicted fourth state; and generating one or more of the at least one frequency offset and the at least one phase offset based on the at least one determined error includes a) generating one or more of the at least one second frequency offset and the at least one second phase offset based on the at least one determined second error, and b) generating one or more of the at least one third frequency offset and the at least one third phase offset based on the at least one determined third error.

17. The method of claim 14, wherein: determining at least one time offset associated with the at least one first sensor and the at least one second sensor by determining a number of cycles of a first clock signal generated by the at least one first sensor between a first time mark signal generated by the at least one first sensor and a second time mark signal generated by the at least one second sensor includes estimating the at least one time offset based on one or more of the at least one frequency offset and the at least one first clock signal; and generating one or more of the at least one frequency offset and the at least one phase offset based on the at least one determined error includes estimating the at least frequency offset based on one or more of the at least one frequency offset and the at least one first clock signal.

18. The method of claim 14, wherein the at least one time offset is a first time offset, the at least one frequency offset is a first frequency offset, and the at least one error is a first error, further comprising: determining at least one fourth time offset associated with the at least one second sensor and at least one fourth sensor communicatively coupled to the at least one second sensor by a communication channel associated with at least one propagation delay by determining a number of cycles of a fourth clock signal generated by the at least one fourth sensor between the second time mark signal and a fourth time mark generated by the at least one fourth sensor; determining a state of the at least one fourth clock signal based on a phase of the at least one second clock signal; predicting a state of the at least one fourth clock signal based on one or more of the at least one second clock signal, at least one fourth frequency offset associated with the at least one second clock signal and the at least one fourth clock signal, at least one fourth phase offset associated with the at least one second clock signal, the at least one fourth clock signal, and the at least one propagation delay; determining at least one fourth error by comparing the at least one determined state of the at least one fourth clock signal and the at least one predicted state of the at least one fourth clock signal; generating one or more of the at least one fourth frequency offset and the at least one fourth phase offset based on the at least one determined fourth error; and correcting one or more of the at least one fourth time offset, the at least one fourth frequency offset, and the at least one fourth phase offset based on the at least one propagation delay.

19. The method of claim 14, further comprising: generating one or more of the at least one first clock signal and the at least one first time mark signal via a clock of the at least one first sensor; sending the one or more of the at least one first clock signal and the at least one first time mark signal to one or more of a first estimator of the at least one first sensor and a time logic circuit of the at least one first sensor; generating at least one interrupt associated with the at least one first time mark signal via the time logic module; sending the at least one interrupt to a first processor of the at least one first sensor via the time logic circuit; connecting a first transceiver of the at least one first sensor to the time logic circuit via the first processor; and sending one or more of the at least one first time mark signal and the at least one first clock signal to the at least one second sensor via the first transceiver.

20. The method of claim 14, further comprising: receiving the at least one first time mark signal via a second transceiver of the at least one second sensor; connecting a second estimator of the at least one second sensor to the second transceiver via a second processor of the at least one second sensor; and receiving, via the second estimator, the at least one first clock signal from the at least one first sensor.

* * * * *